(12) United States Patent
Shigemura et al.

(10) Patent No.: US 8,557,633 B2
(45) Date of Patent: Oct. 15, 2013

(54) ELECTRONIC DEVICE AND MANUFACTURING METHOD OF THE SAME

(75) Inventors: Kunio Shigemura, Kodaira (JP); Kenji Hanada, Kodaira (JP); Masaki Nakanishi, Tokyo (JP); Takafumi Nishita, Iruma (JP); Masayoshi Shinoda, Kumagaya (JP); Seiichi Tomoi, Saku (JP)

(73) Assignee: Renesas Electronics Corporation, Kanagawa (JP)

( * ) Notice: Subject to any disclaimer, the term of this patent is extended or adjusted under 35 U.S.C. 154(b) by 371 days.

(21) Appl. No.: 13/079,939

(22) Filed: Apr. 5, 2011

(65) Prior Publication Data
US 2011/0183474 A1    Jul. 28, 2011

Related U.S. Application Data

(60) Continuation of application No. 12/137,869, filed on Jun. 12, 2008, now abandoned, which is a division of application No. 11/281,476, filed on Nov. 18, 2005, now Pat. No. 7,396,701.

(30) Foreign Application Priority Data

Nov. 19, 2004   (JP) ................................ 2004-336113

(51) Int. Cl.
*H01L 21/00*   (2006.01)
(52) U.S. Cl.
USPC ............. 438/108; 438/107; 438/109; 438/11; 438/127; 438/612; 438/613
(58) Field of Classification Search
USPC ........................ 438/107–110, 127, 612, 613
See application file for complete search history.

(56) References Cited

U.S. PATENT DOCUMENTS 5,982,038 A * 11/1999 Toy et al. ...................... 257/772
6,038,135 A    3/2000 Higashiguchi et al.
6,486,411 B2 * 11/2002 Miura et al. .................. 174/256

(Continued)

FOREIGN PATENT DOCUMENTS

JP     2002-190498 A     7/2002
JP     2002/208668       7/2002

(Continued)

OTHER PUBLICATIONS

Machine Translation of JP 2002/208668 A: Yamaura et al, Semiconductor Device and Method of Manufacturing the Same.

*Primary Examiner* — Bac Au
(74) *Attorney, Agent, or Firm* — Mattingly & Malur, PC

(57) ABSTRACT

A technique that makes it possible to enhance the reliability of a module using PCB as its module substrate is provided. Solder connection of a single-chip component 43, an integrated chip component 44, and a semiconductor chip IC2 by Pb-free solder is carried out by heat treatment at a temperature below 280° C. using a heat block. Solder connection of a semiconductor chip IC1 by high-melting point solder is carried out by heat treatment at a temperature of 280° C. or higher using a hot jet. Thus, the semiconductor chip IC1 can be solder connected to PCB 38 using high-melting point solder without the following troubles: damage to the PCB 38 due to heat, for example, burning of solder resist; and peeling of prepreg from a core material. Therefore, the semiconductor chip IC1 can be mounted over the PCB 38 with high connection strength.

14 Claims, 17 Drawing Sheets

(56) References Cited

U.S. PATENT DOCUMENTS

| | | |
|---|---|---|
| 6,608,381 B1 | 8/2003 | Karasawa et al. |
| 6,649,856 B2 | 11/2003 | Makino et al. |
| 6,831,360 B2 | 12/2004 | Yamaura et al. |
| 7,057,277 B2 | 6/2006 | Chen et al. |
| 7,116,175 B2 | 10/2006 | Shimizu et al. |
| 7,221,049 B2 | 5/2007 | Igarashi et al. |
| 7,241,675 B2 * | 7/2007 | Savastiouk et al. ............ 438/597 |
| 7,722,962 B2 | 5/2010 | Soga et al. |
| 2004/0125579 A1 | 7/2004 | Konishi et al. |

FOREIGN PATENT DOCUMENTS

| | | |
|---|---|---|
| JP | 2002/368186 | 12/2002 |
| JP | 2004-327556 A | 11/2004 |
| WO | WO 0249797 | 6/2002 |

* cited by examiner

US 8,557,633 B2

ELECTRONIC DEVICE AND MANUFACTURING METHOD OF THE SAME

This application is a continuation application of U.S. application Ser. No. 12/137,869, file Jun. 12, 2008, which application is a divisional application of U.S. application Ser. No. 11/281,476, filed Nov. 18, 2005, now U.S. Pat. No. 7,396,701, the entirety of which are incorporated herein by reference.

CROSS-REFERENCE TO RELATED APPLICATION

The present application claims priority from Japanese patent application No. 2004-336113 filed on Nov. 19, 2004, the content of which is hereby incorporated by reference into this application.

BACKGROUND OF THE INVENTION

The present invention relates to an electronic device and a manufacturing technique thereof and in particular to a technique effectively applicable to a manufacturing method of a module.

Mobile communication equipment such as cellular phone adopts a module of such a structure that the following is implemented: for example, a surface mount semiconductor chip over which a power amplifier, an antenna switch, or the like is formed and a surface mount chip component over which a capacitor, a resistor, or the like is formed are mounted over one and the same substrate. The semiconductor chip and the chip component are mounted over the module substrate by solder connection. In addition, they are covered and protected with insulating resin.

For example, Japanese Unexamined Patent Publication No. 2002-208668 (Patent Document 1) discloses a semiconductor device comprising: a semiconductor chip having a plurality of pads formed over its main surface; a chip component having connecting terminals formed at both ends; a module substrate over which the semiconductor chip and the chip component are mounted; a soldered joint at which the chip component is connected with substrate-side terminals of the module substrate by solder; and a sealing portion that covers the semiconductor chip, chip component, and soldered joint and is formed of low-elasticity resin, such as insulating silicone resin.

Japanese Unexamined Patent Publication No. 2002-368186 (Patent Document 2) discloses a modular device of plastic molded type. The modular device is constructed as follows: at lest one of a plurality of circuit elements mounted over a wiring board and electrically connected with outer leads is sealed with a thermosetting resin composition; the entire wiring board, all the elements, and the side of the outer leads in contact with the board are sealed with resin by transfer molding.

[Patent Document 1] Japanese Unexamined Patent Publication No. 2002-208668
[Patent Document 2] Japanese Unexamined Patent Publication No. 2002-368186

SUMMARY OF THE INVENTION

However, manufacturing methods of modules have various technical problems described below.

Modules for cellular phone examined by the present inventors use ceramic substrates resistant to heat and excellent in electric insulation for module substrates over which semiconductor chips and chip components are mounted. However, the ceramic substrate has problems. It requires relatively high cost, and is easily broken by drop impact or the like. Modules for cellular phone are always required to be reduced in size and thickness; however, ceramics are easily broken when thinned. Therefore, it is difficult to reduce the thickness of an entire package in which a semiconductor chip and a chip component are mounted over a ceramic substrate and they are sealed with resin to 1 mm or below.

Consequently, consideration was given to adopting PCB (Printed Circuit Board) for module substrate. The PCB is a resin substrate that is more inexpensive than ceramic substrates and resistant to impact. However, the present inventors found the following problems also with respect to modules using PCB for their module substrates.

When a semiconductor chip mounted with a power amplifier that produces much heat is bonded to PCB, silver paste whose silver (hereafter, notated as "Ag") filler content is, for example, 70 wt % or so is generally used. This is for the improvement of heat dissipation. Meanwhile, it poses a problem of degradation in adhesive strength. This problem can be solved by using, for example, a solder paste having a high melting point (e.g., 280° C. or higher) (e.g., lead (hereafter, notated as "Pb")-10 tin (hereafter, notated as "Sn")) in place of Ag paste. However, this poses new problems due to high-temperature processing at 280° C. or higher. Such problems include burning of solder resist that covers wiring formed over the surface of PCB; stripping of prepreg, which is an insulating resin sheet that constitutes PCB, from core material. In Europe, there is a trend toward Pb restriction, and in this context, Pb-free solder containing no Pb is used to connect a chip component and PCB. The Pb-free solder melts at a temperature of 220° C. or so, and high-temperature processing at 280° C. or higher cannot be applied to PCB.

A semiconductor chip and a chip component are mounted over PCB, and covered and protected with insulating resin. Thereafter, the obtained module is mounted over a mother board by solder connection, and is incorporated into a product. However, during reflow processing (at 250° C. or so, for example) subsequent to the solder connection, Pb-free solder that connects the chip component to the PCB can partially melt in the module, which can lead to troubles, such as short-circuiting. Specifically, for example, semi-molten Pb-free solder flows like a flash, and connecting terminals of the chip component are joined together. This leads to short-circuiting. Where unfilled voids are formed in the narrow gap between the chip component and the PCB, this short-circuiting becomes more pronounced.

An object of the present invention is to provide a technique with which the reliability of a module using PCB for its module substrate can be enhanced.

The above and further objects and novel features of the present invention will be apparent from the description in this specification and the accompanying drawings.

The following is a brief description of the gist of the representative elements of the invention laid open in this application.

In a module in which a semiconductor chip including a power amplifier circuit and a chip component are mounted over PCB by solder connection, according to the present invention, the following is implemented: the back side of the semiconductor chip and substrate-side terminals of the PCB are connected together by high-melting point solder; and the connecting terminals of the chip component and substrate-side terminals of the PCB are connected together by Pb-free solder.

In a manufacturing method of a module in which a semiconductor chip including a power amplifier and a chip component are mounted over PCB by solder connection, according to the present invention, the following operation is performed: the PCB is heated at a temperature below 280° C., and the connecting terminals of the chip component and substrate-side terminals of the PCB are thereby connected together by Pb-free solder; at the same time, heat at 280° C. or higher is locally applied, and the back side of the semiconductor chip and substrate-side terminals of the PCB are connected together by high-melting point solder; further, the semiconductor chip and the chip component are sealed with resin in an reduced-pressure atmosphere, and the gap between the chip component and the PCB is thereby sealed with resin.

The following is a brief description of the gist of effects obtained by the representative elements of the invention laid open in this application.

A semiconductor chip high in adhesive strength can be mounted over PCB without damaging the PCB, and connecting terminals of a chip component can be prevented from being short-circuited to each other due to solder. Thus, the reliability of a module in which a semiconductor chip and a chip component are mounted over PCB can be enhanced.

BRIEF DESCRIPTION OF THE DRAWINGS

FIG. 3(*b*) is a circuitry diagram thereof.

DETAILED DESCRIPTION OF THE PREFERRED EMBODIMENTS

Figure 1:
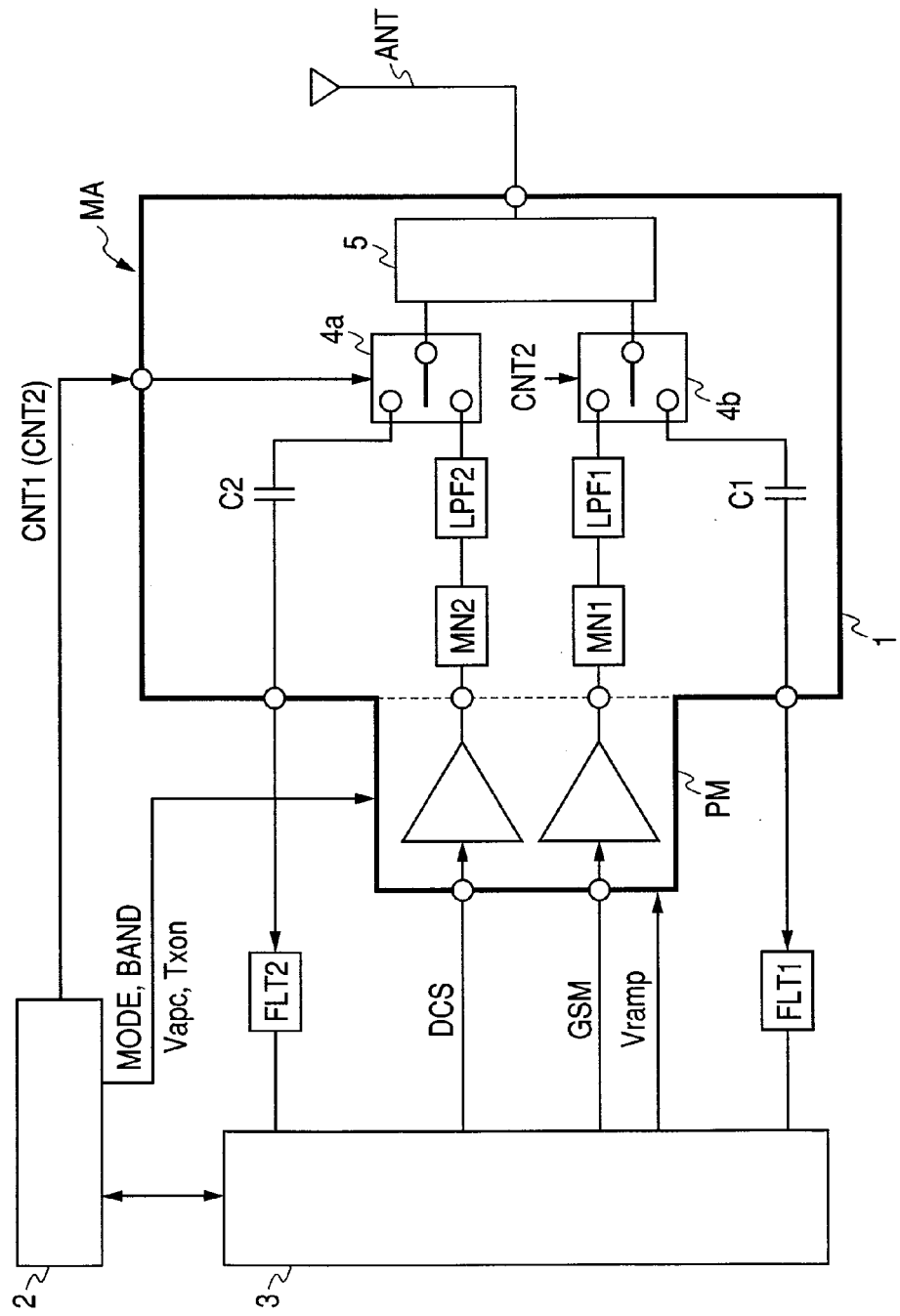
FIG. 1 is a block diagram illustrating an example of the system configuration of a digital cellular phone in a first embodiment.

In the following description, each embodiment will be divided into a plurality of sections or embodiments if necessary for the sake of convenience. Unless explicitly stated otherwise, they are not unrelated to one another, and they are in such a relation that one is a modification, details, supplementary explanation, or the like of part or all of the other. Where mention is made of any number of elements (including a number of pieces, a numeric value, a quantity, a range, and the like) in the following description of embodiments, the number is not limited to that specific number. Unless explicitly stated otherwise or the number is obviously limited to a specific number in principle, the foregoing applies, and the number may be above or below that specific number. In the following description of embodiments, needless to add, their constituent elements (including elemental steps and the like) are not always indispensable unless explicitly stated otherwise or they are obviously indispensable in principle. Similarly, where mention is made of the shape, positional relation, or the like of a constituent element or the like in the following description of embodiments, it includes those substantially approximate or analogous to that shape or the like. This applies unless explicitly stated otherwise or it is apparent in principle that some shape or the like does not include those substantially approximate or analogous to that shape or the like. This is the same with the above-mentioned numeric values and ranges.

Hereafter, detailed description will be given to embodiments of the present invention with reference to the drawings. In every drawing for explaining the embodiments, items having the same functions will be marked with the same reference characters, and the repetitive description thereof will be omitted.

The meaning of terms found in the description of the embodiments will be described before the embodiments are described in detail.

GSM (Global System for Mobile Communication) refers to one of radio communication methods used in digital cellular phones or the standard of it. The GSM uses three frequency bands of radio waves. The 900 MHz band is designated as GSM900 or simply as GSM; the 1800 MHz band is designated as GSM1800, DCS (Digital Cellular System) 1800, or PCN (Personal Communication Network); and the 1900 MHz band is designated as GSM1900, DCS1900, or PCS (Personal Communication Services). The GSM1900 is used mainly in North America. In North America, in addition, the GSM850 for the 850 MHz band may also be used in some cases.

The GMSK (Gaussian filtered Minimum Shift Keying) modulation method is a method used in communication of aural signals, in which the phase of a carrier wave is shifted according to transmit data. The EDGE (Enhanced Data GSM Environment) modulation method is a method used in data communication, in which method amplification shift is added to the phase shift in the GMSK modulation.

In the following description of the embodiments, MOSFET (Metal Oxide Semiconductor Field Effect Transistor) representative of field effect transistors will be abbreviated to MOS and n-channel MOS-FET will be abbreviated to nMOS.

In the following description of the embodiments, of a plurality of surface mount components mounted over one module substrate, a chip in which one or more active elements are formed over one substrate is referred to as "semiconductor chip"; a chip in which a passive element such as capacitor, inductor, resistor, or the like is formed is referred to as "chip component." A chip in which one passive element is formed over one substrate is referred to as "single-chip component," and a chip in which a plurality of passive elements are formed over one substrate is referred to as "integrated chip component." Where they must be discriminated from each other, they will be respectively described as "integrated chip component" or "single-chip component."

First Embodiment

In the description of the first embodiment, a case where the present invention is applied to a digital cellular phone that transmits information utilizing a GSM-based network will be taken as an example.

FIG. 1 illustrates an example of the system of a digital cellular phone in the first embodiment. In the figure, reference code PM denotes a power amplifier; ANT denotes an antenna for transmitting and receiving signal waves; numeral 1 denotes a front-end device; 2 denotes a baseband circuit that converts an aural signal into a baseband signal and a received signal into an aural signal, and generates a modulation method switching signal or a band switching signal; 3 denotes a circuit for modulation/demodulation that down-converts and demodulates a received signal to generate a baseband signal and modulates a transmitted signal; codes FLT1 and FLT2 denote filters that remove noise and interfering waves from a received signal. The filter FLT1 is for GSM, and the filter FLT2 is for DCS.

The front-end device 1 comprises impedance matching circuits MN1 and MN2, low-pass filters LPF1 and LPF2, switch circuits 4a and 4b, capacitors C1 and C2, and a branching filter 5. The impedance matching circuits MN1 and MN2 are circuits that are connected to the transmission output terminals of the power amplifier PM and carry out impedance matching. The low-pass filters LPF1 and LPF2 are circuits that attenuate harmonics. The switch circuits 4a and 4b are circuits for switching between transmission and reception. The capacitors C1 and C2 are elements that cut direct-current components from received signals. The branching filter 5 is a circuit that branches GSM900 signals and DCS1800 signals from each other. In the digital cellular phone in the first embodiment, the power amplifier PM and the front-end device 1 are assembled into one module MA.

Switching signals CNT1 and CNT2 for the switch circuits 4a and 4b are supplied from the baseband circuit 2. The baseband circuit 2 is constructed of a plurality of semiconductor integrated circuits such as DSP (Digital Signal Processor), microprocessor, and semiconductor memory.

Figure 2:
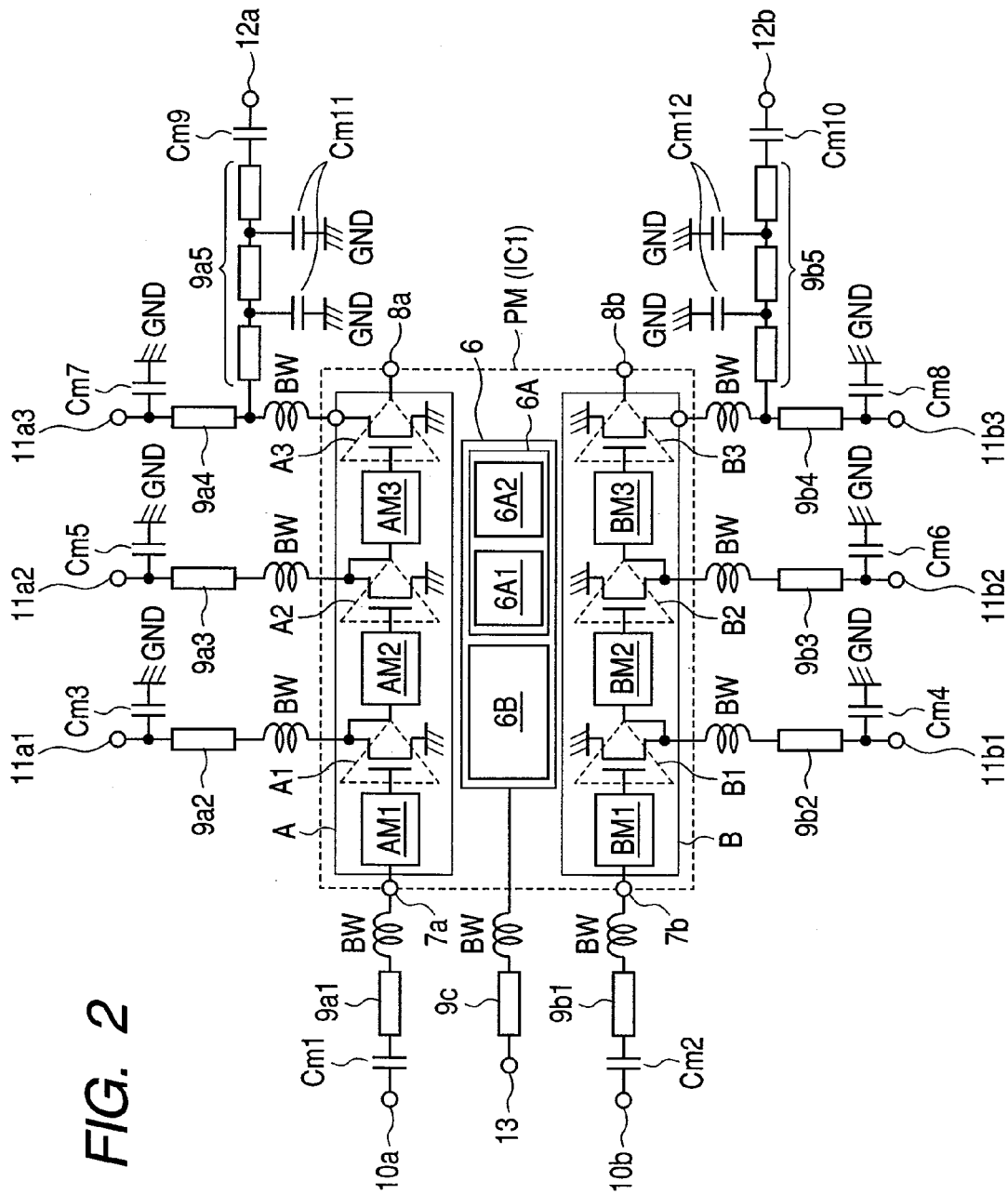
FIG. 2 is a circuit diagram illustrating an example of a power amplifier used in a digital cellular phone handset in the first embodiment.

FIG. 2 illustrates an example of the circuitry of the power amplifier PM.

The power amplifier PM is so constructed that the following is implemented: it can use two frequency bands, for example, the GSM900 band and the DCS1800 band (dual band type) and can use two transmission methods, the GMSK modulation method and the EDGE modulation method, in each frequency band.

This power amplifier PM comprises a power amplifier circuit A for GSM900, a power amplifier circuit B for DCS1800, and a peripheral circuit 6 that controls and corrects the amplifying operation of the power amplifier circuits A and B and performs other like operations. The power amplifier circuits A and B respectively have three amplifying stages A1 to A3 and B1 to B3 and three matching circuits AM1 to AM3 and BM1 to BM3. More specific description will be given. The input terminals 7a and 7b of the power amplifier PM are electrically connected to the first amplifying stages A1 and B1 through the matching circuits AM1 and BM1 for input. The outputs of the first amplifying stages A1 and B1 are electrically connected to the inputs of the second amplifying stages A2 and B2 through the matching circuits AM2 and BM2 for interstage. The outputs of the second amplifying stages A2 and B2 are electrically connected to the inputs of the final amplifying stages A3 and B3 through the matching circuits AM3 and BM3 for interstage. The outputs of the final amplifying stages A3 and B3 are electrically connected to output terminals 8a and 8b. In the first embodiment, the elements that constitute these power amplifier circuits A and B are provided in one semiconductor chip IC1.

The peripheral circuit 6 comprises a control circuit 6A, a bias circuit 6B that applies a bias voltage to the amplifying stages A1 to A3 and B1 to B3, and the like. The control circuit 6A is a circuit that generates a desired voltage to be applied to the power amplifier circuits A and B. The control circuit comprises a power supply control circuit 6A1 and a bias voltage generation circuit 6A2. The power supply control circuit 6A1 is a circuit that generates a first power supply voltage to be applied to the respective outputs of the amplifying stages A1 to A3 and B1 to B3. The bias voltage generation circuit 6A2 is a circuit that generates a first control voltage for controlling the bias circuit 6B.

The first embodiment is so constructed that the following operation is performed: the power supply control circuit 6A1 generates the first power supply voltage based on an output level specifying signal supplied from the baseband circuit 2 external to the power amplifier PM; then, the bias voltage generation circuit 6A2 generates the first control voltage based on the first power supply voltage generated at the power supply control circuit 6A1. The baseband circuit 2 is a circuit that generates the output level specifying signal. This output level specifying signal is a signal that specifies the output levels of the power amplifier circuits A and B. It is generated based on the output level corresponding to the distance between the relevant cellular phone and a base station, that is, the intensity of radio waves. In the first embodiment, the elements that constitute this peripheral circuit 6 are also provided in one semiconductor chip IC1.

Terminals for external are formed over the main surface (face where the circuit elements are formed) of the semiconductor chip IC1 that constitutes the power amplifier PM. The substrate-side terminals are formed over the component mounting face of the module substrate where the semiconductor chip IC1 is mounted. The terminals for external and the substrate-side terminals are connected with each other through connecting material (e.g., bonding wires BW). The input and output of each amplifying stage are electrically connected to the transmission lines 9a1 to 9a5, 9b1 to 9b5, and 9c over the component mounting face of the module substrate through this connecting material.

The transmission lines 9a1 and 9b1 connected to the inputs of the first amplifying stages A1 and B1 through bonding wires BW are electrically connected to input terminals 10a and 10b through capacitors Cm1 and Cm2, respectively. The transmission lines 9a2 and 9b2 electrically connected to the outputs of the first amplifying stages A1 and B1 through bonding wires BW are electrically connected to high potential-side power supply terminals 11a1 and 11b1, respectively. At the same time, the transmission lines 9a2 and 9b2 are electrically connected to ground potential GND through capacitors Cm3 and Cm4, respectively, placed in proximity to the power supply terminals 11a1 and 11b1. The transmission lines 9a3 and 9b3 electrically connected to the outputs of the second amplifying stages A2 and B2 through bonding wires BW are electrically connected to high potential-side power supply terminals 11a2 and 11b2, respectively. At the same time, the transmission lines 9a3 and 9b3 are electrically connected to ground potential GND through capacitors Cm5 and Cm6, respectively, placed in proximity to the power supply terminals 11a2 and 11b2. The transmission lines 9a4 and 9b4 electrically connected to the outputs of the final amplifying stages A3 and B3 through bonding wires BW are electrically connected to high potential-side power supply terminals 11a3 and 11b3, respectively. At the same time, the transmission lines 9a4 and 9b4 are electrically connected to ground potential GND through capacitors Cm7 and Cm8, respectively, placed in proximity to the power supply terminals 11a3 and 11b3. The transmission lines 9a5 and 9b5 electrically connected to the outputs of the final amplifying stages A3 and B3 through bonding wires BW are electrically connected to output terminals 12a and 12b through capacitors Cm9 and Cm10, respectively. At the same time, the transmission lines 9a5 and 9b5 are electrically connected to ground potential GND through capacitors Cm11 and Cm12, respectively, placed at some midpoints in the lines. The transmission line 9c electrically connected to the terminal for external for controlling the peripheral circuit 6 through a bonding wire BW is electrically connected to a control terminal 13. The bonding wires BW have the functions of inductor. The transmission lines 9a1 to 9a5 and 9b1 to 9b5 have the functions of inductor for impedance matching. The capacitors Cm1 to Cm12 have the functions of capacitor for impedance matching, and are constructed of chip components.

Figure 3A:
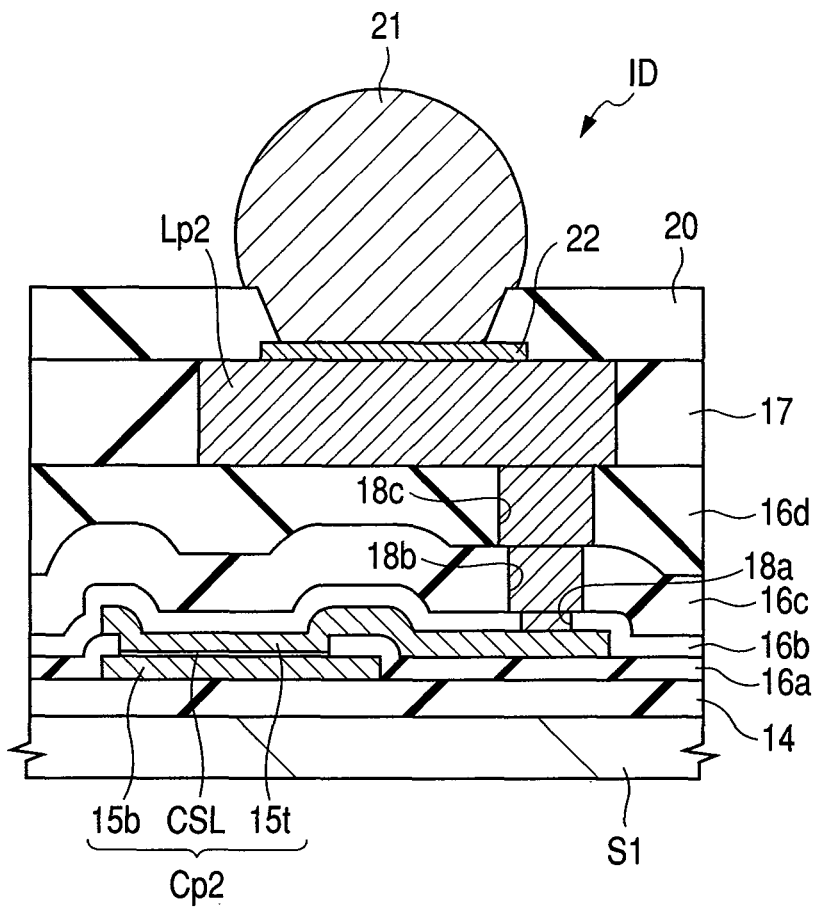
FIG. 3(*a*) is a substantial part sectional view illustrating an example of the structure of a low-pass filter mounted in a front-end device in the first embodiment.
Figure 3B:
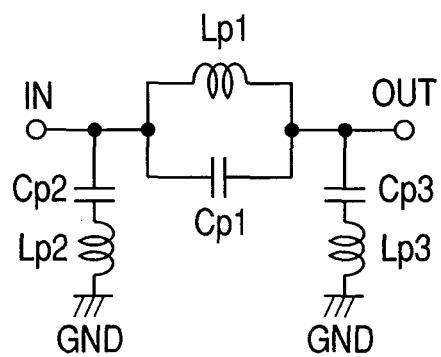

Description will be given to the structure of representative elements in the front-end device 1 and the power amplifier PM mounted in the module MA. FIGS. 3(a) and 3(b) are explanatory drawings of the structure of the low-pass filters LPF1 and LPF2 that constitute the front-end device 1. FIG. 4 to FIG. 7 are explanatory drawings of the structure of the amplifying stages A1 to A3 and B1 to B3 that constitute the power amplifier PM.

Description will be given to an example of the structure of the low-pass filters LPF1 and LPF2 that constitute the front-end device 1 with reference to the substantial part sectional view shown in FIG. 3(a). The low-pass filters LPF1 and LPF2 are an integrated chip components, or so-called IPDs (Integrated Passive Devices), in which a plurality of passive elements are formed over one substrate. FIG. 3(b) illustrates an example of their circuitry. With reference to FIG. 3(a), description will be given to the structure of the capacitor Cp2 and the inductor Lp2 in the circuitry (capacitors Cp1 to Cp3 and inductors Lp1 to Lp3) illustrated in FIG. 3(b).

The semiconductor substrate (hereafter, simply referred to as "substrate") S1 that constitutes the integrated chip component ID is formed of, for example, a single crystal of $p^+$-type silicon (Si). The other elements, for example, a resistor and the like, are formed over the substrate S1, and are covered with an insulating film 14. However, the description of them will be omitted. The capacitor Cp2 comprising a lower layer electrode 15b, a capacitive insulating film CSL, and an upper layer electrode 15t is formed over the insulating film 14. The lower layer electrode 15b and the upper layer electrode 15t are comprised of, for example, an aluminum (Al) alloy film. The capacitive insulating film CSL is formed of, for example, silicon nitride (SiN or the like). In the region where the capacitive insulating film CSL is not formed, the lower layer electrode 15b and the upper layer electrode 15t are insulated from each other by a silicon oxide ($SiO_2$ or the like) film 16a. The upper layer electrode 15t is covered with an insulating film formed by depositing a silicon nitride ($SiN_2$ or the like) film 16b, a silicon oxide film 16c, and a polyimide resin film 16d in this order from bottom up. The surface of the polyimide resin film 16d is planarized.

The inductor Lp2 comprised of, for example, a copper (hereafter, notated as "Cu") film is formed over the polyimide resin film 16d. This inductor Lp2 is formed by forming a trench in a predetermined region in an insulating film 17 deposited over the polyimide resin film 16d, and filling this trench with a Cu film. The inductor Lp2 is connected to the upper layer electrode 15t, one electrode of the capacitor Cp1, through connection holes 18a to 18c formed in the silicon nitride film 16b, silicon oxide film 16c, and polyimide resin film 16d. The top of the inductor Lp2 is covered with a polyimide resin film 20. An opening is formed in part thereof, and a bump electrode 21 that is a bump-like protruding electrode formed of solder is connected with the inductor Lp2 there. A plating layer 22 is formed between the inductor Lp2 and the bump electrode 21. It is formed by depositing a nickel (hereafter, notated as "Ni") film and a gold (hereafter, notated as "Au") film in this order from bottom up and patterning them.

As mentioned above, the low-pass filters LPF1 and LPF2 are formed by forming the capacitors Cp1 to Cp3 and the inductors Lp1 to Lp3 over one substrate S1. The integrated chip component ID with the low-pass filters LPF1 and LPF2 formed therein is mounted over the module substrate with its main surface facing downward (face down). The connecting terminals (e.g., bump electrodes 21) formed over the main surface of the integrated chip component ID and substrate-side terminals formed over the component mounting face of the module substrate are electrically connected with each other.

Figure 4:
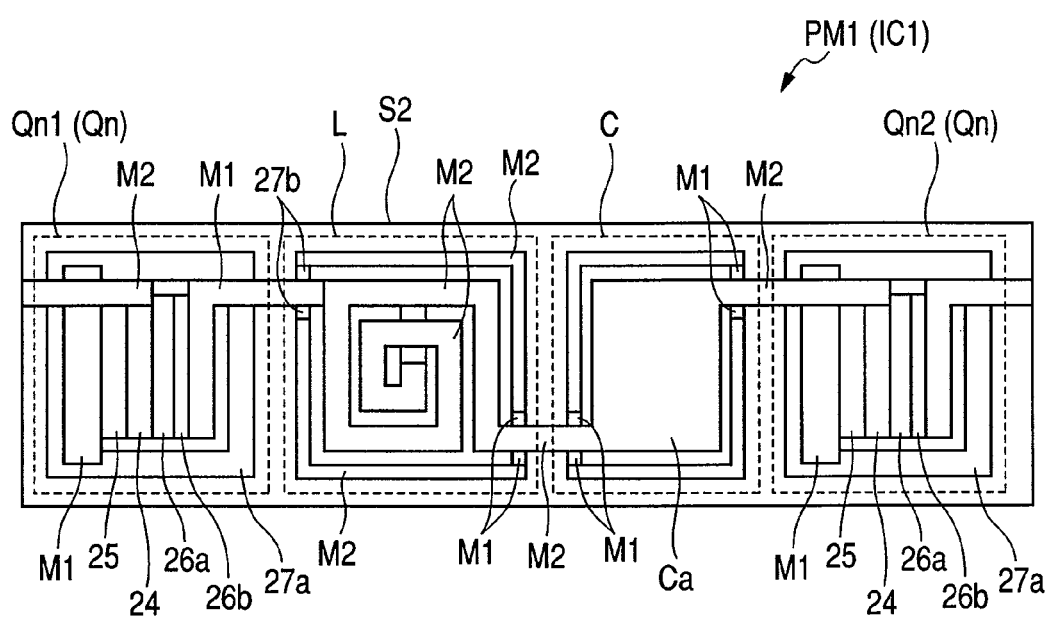
FIG. 4 is a substantial part plan view illustrating an example of the internal configuration of a semiconductor chip in which the amplifying stage of a power amplifier in the first embodiment is constructed of nMOSs.
Figure 5:
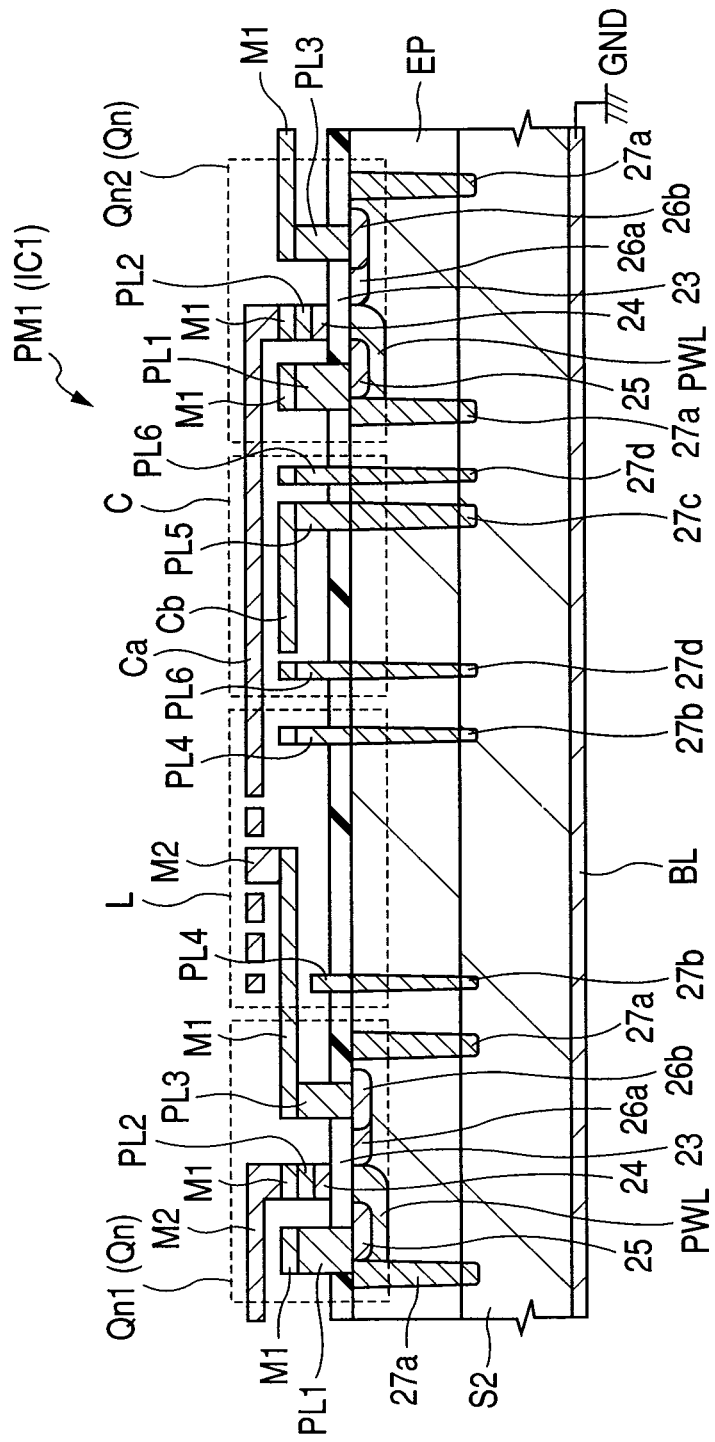
FIG. 5 is a substantial part sectional view illustrating an example of the internal configuration of a semiconductor chip in which the amplifying stage of a power amplifier in the first embodiment is constructed of nMOSs.

Description will be given to an example of the internal configuration of the power amplifier PM1 in which its amplifying stages are constructed of nMOSs with reference to the substantial part plan view illustrated in FIG. 4 and the substantial part sectional view illustrated in FIG. 5. This power amplifier PM1 is formed in one semiconductor chip IC1.

The substrate S2 with the power amplifier PM1 formed thereover is formed of, for example, a single crystal of P$^+$-type silicon. It is formed as a low-resistance substrate whose resistivity is, for example, 1 to 10 mΩ·cm or so. An epitaxial layer EP formed of, for example, a single crystal of P$^-$-type silicon is formed over the substrate S2. The resistivity of the epitaxial layer EP is higher than the resistivity of the substrate S2. The following are formed over the main surface of the epitaxial layer EP: nMOSs Qn for the amplifying stages A1 to A3 and B1 to B3; an inductor L for the matching circuits AM1 to AM3 and BM1 to BM3; a capacitor C having a high Q (Quality factor) value; and transmission lines. These figures show the nMOSs Qn1 and Qn2 of the second amplifying stages. In reality, however, the first to third amplifying stages A1 to A3 and B1 to B3 in two systems are all formed over one and the same substrate S2. NMOS Qn cited here denotes a unit MOS, and in reality, each of the amplifying stages A1 to A3 and B1 to B3 is constructed by connecting a plurality of the unit MOSs in parallel.

The nMOS Qn is comprised of, for example, a lateral MOS such as LDMOS (Laterally Diffused MOS). P-type wells PWL are formed in the formation regions for the nMOS Qn in the epitaxial layer EP. The wells PWL are formed by ion-implanting, for example, boron (B) impurities into the epitaxial layer EP. The gate insulating film 23 of the nMOSs Qn is formed over the wells PWL. This gate insulating film 23 is formed of, for example, silicon oxide by, for example, thermal oxidation. The gate electrodes 24 of the nMOSs Qn are formed over the gate insulating film 23. The gate electrodes 24 are constructed of a laminated conductor film of, for example, polycrystalline silicon and a metal silicide layer (e.g., titanium silicide ($TiSi_2$) layer or cobalt silicide (CoSi) layer) formed thereover. The channels of the nMOSs Qn are formed at the upper parts of the wells PWL under the gate electrodes 24.

N$^+$-type semiconductor regions 25 are formed in the wells PWL in proximity to the ends of the gate electrodes 24 on one side. The n$^+$-type semiconductor regions 25 are regions that function as the sources of the nMOSs Qn, and are formed by ion-implanting, for example, phosphorus (P) impurities into the wells PWL. N$^-$-type semiconductor regions 26a are formed in the epitaxial layer EP in proximity to the ends of the gate electrodes 24 on the other side. N$^+$-type semiconductor regions 26b are formed in the places at the distance equivalent to the n$^-$-type semiconductor regions 26a from the other-side ends of the gate electrodes 24. The n$^+$-type semiconductor regions 26b are so formed that they are electrically connected with the n$^-$-type semiconductor regions 26a (LDD (Lightly Doped Drain) structure). The n$^-$-type semiconductor regions 26a and the n$^+$-type semiconductor regions 26b are regions that function as the drains of the nMOSs Qn. They are formed by ion-implanting, for example, phosphorus impurities into the wells PWL.

A p$^{++}$-type semiconductor region 27a is formed in the epitaxial layer EP in each nMOS Qn formation region so that they are in contact with the n$^+$-type semiconductor regions 25 and 26b. The p$^{++}$-type semiconductor regions 27a are formed with, for example, boron introduced. They are so formed that the nMOSs Qn are encircled therewith as viewed in a plan view and they extend from the main surface of the epitaxial layer EP to the substrate S2 as viewed in a sectional view. The n$^+$-type semiconductor regions 25 for the sources of the individual nMOSs Qn are electrically connected with the p$^{++}$-type semiconductor regions 27a through plugs PL1. They are electrically connected with the low-resistance substrate S2 through the p$^{++}$-type semiconductor regions 27a.

As described later, the semiconductor chip IC1 is mounted over the module substrate with its back side facing toward the component mounting face of the module substrate. The substrate S2 is electrically connected with substrate-side terminals of the module substrate mounted with the semiconductor chip IC1 through the electrode BL formed of metal over its entire back side. The substrate S2 is electrically connected to reference potential (e.g., ground potential GND at 0V or so: fixed potential) through its wiring. That is, the substrate S2 is used as a grounding portion common to a plurality of the nMOSs Qn formed in the semiconductor chip IC1.

The plug PL1 connected with the n$^+$-type semiconductor region 25 for the source of the nMOS Qn1 in the preceding stage is electrically connected with a first-layer wiring M1. The gate electrode 24 of the nMOS Qn1 is a second-layer wiring M2 through a plug PL2 and the first-layer wiring M1. The second-layer wiring M2 is a wiring for the input of the nMOS Qn1. The n$^+$-type semiconductor region 26b for the drain of the nMOS Qn1 is electrically connected with the first-layer wiring M1 through a plug PL3. The first-layer wiring M1 is electrically connected with one end of the inductor L.

This inductor L is formed of, for example, the spiral second-layer wiring M2. The periphery of the inductor L is encircled with the first-layer wiring M1 for shielding, the second-layer wiring M2, a plug PL4, and the p$^{++}$-type semiconductor region 27b. The first-layer wiring M1 for shielding, second-layer wiring M2, plug PL4, and p$^{++}$-type semiconductor region 27b are electrically connected with one another. (They are insulated from the inductor L.) They are electrically connected with the low-resistance substrate S2 through the p$^{++}$-type semiconductor region 27b, and set to ground potential GND. The other end of the inductor L is electrically connected to the upper electrode Ca of the capacitor C through the second-layer wiring M2.

A lower electrode Cb is formed in the wiring layer under the upper electrode Ca of the capacitor C so that it is opposed to the upper electrode Ca with the insulating film in-between. This lower electrode Cb is electrically connected with a p$^{++}$-type semiconductor region 27c through a plug PL5, and further electrically connected with the low-resistance substrate S2 through the p$^{++}$-type semiconductor region 27c. The periphery of this capacitor C is also encircled with the first-layer wiring M1 for shielding, the second-layer wiring M2, a plug PL6, and a p$^{++}$-type semiconductor region 27d. The first-layer wiring M1 for shielding, second-layer wiring M2, plug PL6, and P$^{++}$-type semiconductor region 27d are electrically connected with one another. (They are insulated from the capacitor C.) They are electrically connected with the low-resistance substrate S2 through the p$^{++}$-type semiconductor region 27d, and are set to ground potential GND. The upper electrode Ca of this capacitor C is electrically connected with the gate electrode 24 of the nMOS Qn2 through the second-layer wiring M2. The plugs PL1 to PL6 are formed of metal such as tungsten (W). The first-layer wiring M1 and the second-layer wiring M2 are formed of metal using, for example, aluminum or Cu as the principal wiring material.

The semiconductor chip IC1 with the power amplifier PM1 formed therein is mounted over the module substrate with its main surface facing upward (face up). The terminals for external of the semiconductor chip IC1 and substrate-side terminals formed over the component mounting face of the module substrate are electrically connected with each other through connecting material. An example of the connecting material is a bonding wire BW comprised of an Au fine wire.

Figure 6:
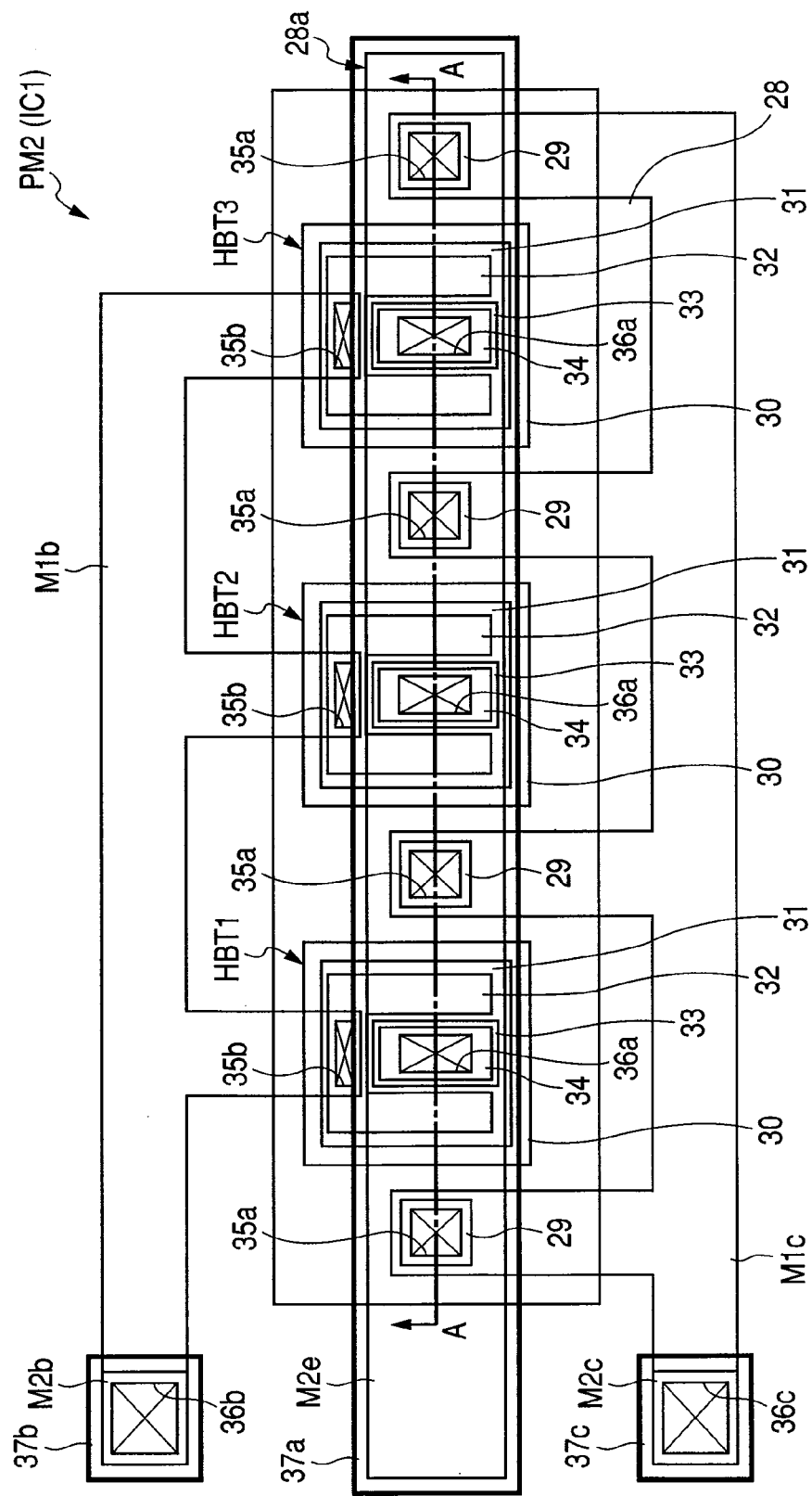
FIG. 6 is a substantial part plan view illustrating an example of the internal configuration of a semiconductor chip in which the amplifying stage of a power amplifier in the first embodiment is constructed of hetero-junction bipolar transistors.
Figure 7:
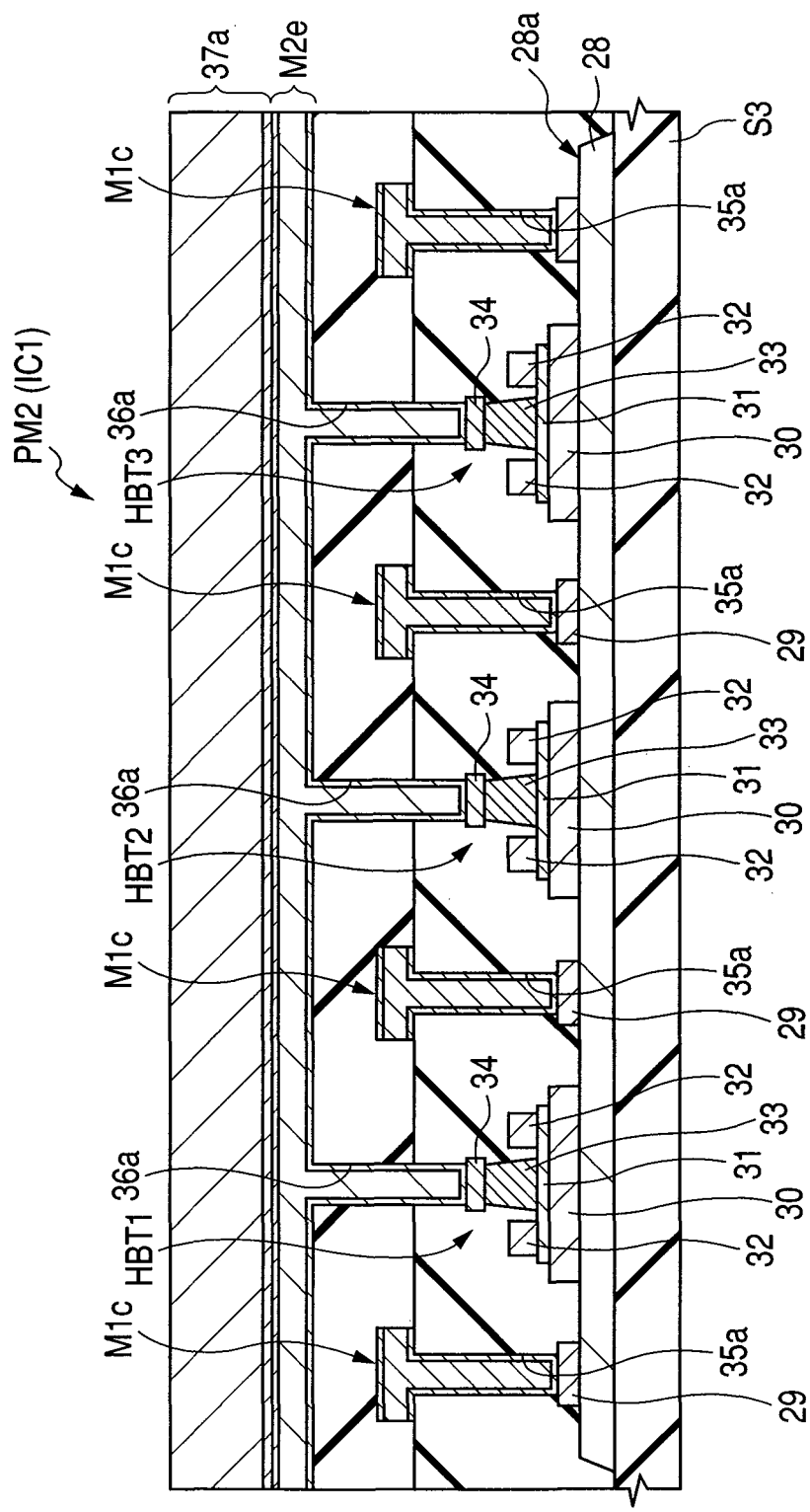
FIG. 7 is a substantial part sectional view taken along the line A-A of FIG. 6.

Description will be given to an example of the internal configuration of a power amplifier PM2 in which its amplifying stages are constructed of hetero-junction bipolar transistors (HBTs) with reference to the substantial part plan view shown in FIG. 6 and the substantial part sectional view shown in FIG. 7. (FIG. 7 is a sectional view taken along the line A-A of FIG. 6.) As in the case where the amplifying stages are constructed of nMOSs, the power amplifier PM2 is formed in one semiconductor chip IC1.

Of the amplifying stages A1 to A3 and B1 to B3 illustrated in FIG. 2, the amplifying stages A1 and B1 used as the first stages require noise reduction. Therefore, it is preferable that they should be constructed of, for example, nMOSs. The amplifying stages A3 and B3 used as the last stages require a high amplification factor; therefore, it is preferable that they should be constructed of, for example, HBTs. Either of nMOSs and HBTs may be used for the amplifying stages A2 and B2 used as the intermediate stages. Therefore, where the amplifying stages A1, A2, B1, and B2 are constructed of nMOSs and the amplifying stages A3 and B3 are constructed of HBTs, the following measure is taken: the power amplifier is not formed in one semiconductor chip but it is divided and formed in two semiconductor chips. In reality, one amplifying stage is formed by connecting a plurality of unit HBTs in parallel. Here, description will be given to three HBTs, HBT1 to HBT3, that constitute the amplifying stage A3 used as a final stage, for example.

A substrate S3 with the HBT1 to HBT3 formed thereover is comprised of, for example, a semi-insulating GaAs substrate S3. The HBT1 to HBT3 are formed over, for example, a sub-collector layer 28, comprised of an n$^+$-type GaAs layer isolated from other elements by mesa isolation 28a, at predetermined intervals. The HBT1 to HBT3 are similarly constructed; therefore, description will be given to, for example, the construction of the HBT1 formed at the left end of the HBT1 to the HBT3. The HBT1 has a collector electrode 29 formed over the sub-collector layer 28 and a collector mesa 30 formed at a predetermined distance from the collector electrode 29. The collector electrode 29 is formed of, for example, Au.

The collector mesa 30 is formed of, for example, an n-type GaAs layer. The collector mesa 30 and the collector electrode 29 are electrically connected with each other through the sub-collector layer 28. A base mesa 31 comprised of, for example, a p-type GaAs layer is formed over the collector mesa 30.

A base electrode 32 formed of Au or the like is formed in the peripheral region over the base mesa 31. That is, a base electrode 32 in such a shape that U shape is turned counterclockwise through 90 degrees is formed over the base mesa 31. An emitter layer 33 is formed over the substantially central portion of the base mesa 31, and an emitter electrode 34 is formed over the emitter layer 33. The emitter layer 33 is formed of a laminated film obtained by depositing, for example, an n-type InGaP layer, a GaAs layer, and an InGaAs layer in this order from bottom up. The emitter electrode 34 is formed of, for example, tungsten silicide (WSi).

Thus, a heterogeneous semiconductor junction (hetero-junction) is formed between the base mesa (p-type GaAs layer) 31 and the emitter layer (n-type InGaP layer) 33. The HBT1 in the first embodiment has such a structure that the following is implemented: the collector electrode 29 is formed in the lowermost layer; the emitter electrode 34 is formed in the uppermost layer; and the base electrode 32 is formed in the intermediate layer.

The HBT1 is constructed as mentioned above, and the HBT2 and the HBT3 having the same construction as the HBT1 are formed laterally side by side.

The respective collector electrodes 29 of the HBT1 to the HBT3 are connected in common to a first collector wiring M1c through connection holes 35a filled with conductive material. That is, the first collector wiring M1c electrically connects together the collector electrodes 29 of the HBT1 to the HBT3, and is formed in a first wiring layer. The respective base electrodes 32 of the HBT1 to the HBT3 are connected in common to a first base wiring M1b through connection holes 35b filled with conductive material. This first base wiring M1b is also formed in the first wiring layer as the first collector wiring M1c is.

The respective emitter electrodes 34 of the HBT1 to the HBT3 are connected in common to an emitter wiring M2e through connection holes 36a filled with conducting material. That is, the emitter wiring M2e is extended in the direction in which the HBT1 to the HBT3 are placed side by side. It is connected to the individual emitter electrodes 34 through the connection holes 36a filled with conducting material. This emitter wiring M2e is formed in a second wiring layer positioned above the first wiring layer. The reason why the emitter wiring M2e is formed in the second wiring layer is that the emitter electrodes 34 are formed at a level higher than the base electrodes 32 and the collector electrodes 29. The first collector wiring M1c is connected to a second collector wiring M2c through a connection hole 36c filled with conducting material, and the first base wiring M1b is connected to a second base wiring M2b through a connection hole 36b filled with conducting material. The second collector wiring M2c and the second base wiring M2b are formed in the second wiring layer.

An emitter bump electrode 37a is formed directly on the emitter wiring M2e formed in the second wiring layer. More specific description will be given. The emitter bump electrode 37a is formed in a third wiring layer, and this third wiring layer is formed directly on the second wiring layer without connection holes between it and the second wiring layer.

The emitter bump electrode 37a is extended in the direction in which the HBT1 to the HBT3 are placed side by side. It is electrically connected to the individual emitter electrodes 34 through the emitter wiring M2e formed in the second wiring layer. A collector bump electrode 37c is formed directly on the second collector wiring M2c, and a base bump electrode 37b is formed directly on the second base wiring M2b. The collector bump electrode 37c, emitter bump electrode 37a, and base bump electrode 37b are formed in the same wiring layer, or the third wiring layer. Therefore, the element formation face of the semiconductor chip IC is planarized.

The semiconductor chip IC1 with the power amplifier PM2 formed therein is mounted over the module substrate with its main surface facing downward (face down). The collector bump electrode 37c, emitter bump electrode 37a, and base bump electrode 37b are connected with substrate-side terminals formed over the component mounting face of the module substrate.

Figure 8:
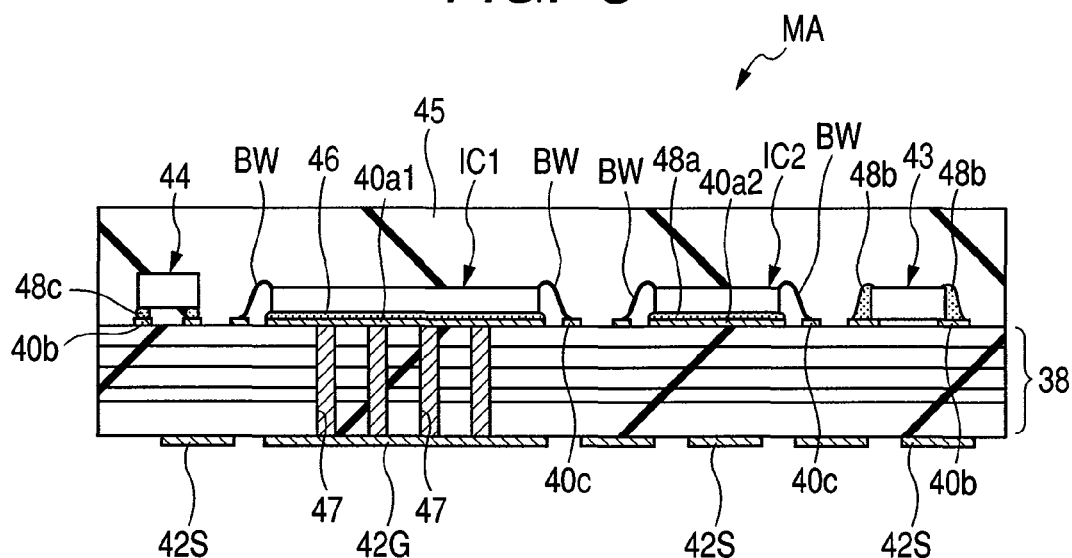
FIG. 8 is a schematic sectional view illustrating an example of the primary mounting of a module in a digital cellular phone handset in the first embodiment.

Description will be given to the configuration of the module MA that underwent primary winding and had surface mount components mounted over its module substrate. FIG. 8 illustrates an example of the primary mounting of the module MA in a digital cellular phone handset in the first embodiment. In this example, the above-mentioned front-end device 1 and the power amplifier PM is assembled into one module MA. However, the present invention is not limited to this construction, needless to add. For example, the front-end device 1 and the power amplifier PM may be constructed as different modules. Here, description will be given, taking as an example the semiconductor chip IC1 having the power amplifier PM1 whose amplifying stages are constructed of nMOSs. Instead, a semiconductor chip having a power amplifier PM2 whose amplifying stages are constructed of HBTs may be used. In this case, face down connection is adopted and it is mounted with its main surface facing toward the main surface of the module substrate. Where the frontward amplifying stages are constructed of nMOSs and the rearward amplifying stages are constructed of HBTs, two semiconductor chips are used for the power amplifier PM.

The module MA uses as its substrate a PCB (first wiring board) 38 having a multilayer interconnection structure in which a plurality of insulator boards are laminated and integrated. Substrate-side terminals 40a1, 40a2, 40b, and 40c comprised of, for example, a Cu film, wiring, and the like are patterned and formed over the component mounting face (first face) of the PCB 38. Electrodes 42G and 42S comprised of, for example, a Cu film is formed over the backside (second face). In addition, FIG. 8 illustrates the following as examples of surface mount components mounted over the component mounting face of the PCB 38: semiconductor chips IC1 and IC2 with active elements formed therein; a single-chip component 43 obtained by forming one passive element over one chip substrate; and an integrated chip component 44 obtained by forming a plurality of passive elements over one chip substrate. These surface mount components are covered with highly elastic resin 45 for sealing. The resin 45 is, for example, highly elastic epoxy resin, and it is preferable that the allowable range of its modulus of elasticity should be not less than 2 GPa at a temperature of 180° C. or higher.

Of the two semiconductor chips IC1 and IC2 illustrated in FIG. 8 as an example, one semiconductor chip IC1 is an active element that produces more heat than passive elements, and it is, for example, a power amplifier PM1. The other semiconductor chip IC2 is an active element that produces less heat than the semiconductor chip IC1, and it is, for example, an antenna switch. A plurality of terminals for external (surface electrodes) formed over the main surfaces of the semiconductor chips IC1 and IC2 are connected with the corresponding substrate-side terminals 40c of the PCB 38 through connecting material. In this example, a bonding wire BW comprised of an Au fine wire is used for the connecting material.

The back side of the semiconductor chip IC1 is bonded to substrate-side terminals (first substrate-side terminals) 40a1 for chip mounting formed over the component mounting face of the PCB 38. The semiconductor chip IC1 is secured over the PCB 38 using solder (first solder) 46 as die bond material. For this solder 46, for example, a high-melting point solder that goes into a liquid state at a temperature of 280° C. or higher, for example, Pb—Sn solder containing Pb is used. The appropriate range of the Sn content of the Pb—Sn solder is considered to be between 2 and 30 wt % inclusive. (The present invention is not limited to this range depending on other conditions, needless to add.) The range suitable for mass production is between 2 and 10 wt % inclusive; however, it is considered that the most appropriate range is the vicinity of 10 wt % with this value taken as the center value. Use of a high-melting point solder brings the following advantages: even if much heat is produced, the adhesive strength can be ensured between the semiconductor chip IC1 and the PCB 38, and the semiconductor chip IC1 can be prevented from peeling off the PCB 38.

The back side electrode of the semiconductor chip IC1 (e.g., the back side electrode BL in FIG. 5) is electrically and thermally joined with the electrode 42G formed on the back side of the PCB 38 through the following: the conducting material in a plurality of heat dissipation vias 47 so formed that they penetrate the PCB 38 from its component mounting face to its back side. This electrode 42G is supplied with reference potential (e.g., ground potential GND at 0V or so). That is, the reference potential supplied to the electrode 42G on the back side of the PCB 38 is supplied to the back side of the semiconductor chip IC1 through the heat dissipation vias 47 and substrate-side terminals 40a1. Conversely, heat produced when the semiconductor chip IC1 operates is transmitted from the back side of the semiconductor chip IC1 through the substrate-side terminals 40a1 for chip mounting and the heat dissipation vias 47. The heat is transmitted to the electrode 42G formed on the back side of the PCB 38, and dissipated there. Electrodes 42S formed in proximity to the periphery of the back side of the PCB 38 are electrodes for signals.

The back side of the semiconductor chip IC2 is joined with the substrate-side terminals 40a2 for chip mounting formed over the component mounting face of the PCB 38. The semiconductor chip IC2 is secured over the PCB 38 using solder 48a as die bond material. For this solder 48a, for example, Pb-free solder containing no Pb that goes into a liquid state at a temperature of 200° C. or higher is used. An example of this solder is Sn containing 3 wt % of Ag and 0.5 wt % of Cu (hereafter, denoted as "Sn-3Ag-0.5Cu solder).

The single-chip component 43 is, for example, a surface mount component obtained by mounting a passive element such as capacitor, inductor, resistor, ferrite bead, or the like over one substrate. A ferrite bead has such a structure that an internal electrode for energization is embedded in a ferrite device. It is an element wherein ferrite functions as magnetic material and high-frequency current components that make a source of electromagnetic interference (EMI) noise are thereby absorbed. The single-chip component 43 is mounted over the PCB 38 with its back side opposed to the component mounting face of the PCB 38. The connecting terminals formed at both ends of the single-chip component 43 are solder connected to substrate-side terminals (second substrate-side terminals) 40b formed over the component mounting face of the PCB 38 through solder (second solder) 48b. For this solder connection, Pb-free solder containing no Pb, for example, Sn-3Ag-0.5Cu solder is used. The distance between the back side of the single-chip component 43 and the component mounting face of the PCB 38 is, for example, 10 μm or so. This gap is filled with resin 45 for sealing without formation of voids.

The integrated chip component 44 is, for example, a surface mount component in which a plurality of passive elements such as the low-pass filters LPF1 and LPF2 illustrated in FIG. 3 are formed. The integrated chip component 44 is flip chip connected to the PCB 38. The connecting terminals (e.g., the bump electrodes 21 in FIG. 3) formed over the main surface of the integrated chip component 44 are solder connected to substrate-side terminals (second substrate-side terminals) 40b formed over the component mounting face of the PCB 38. This solder connection is carried out through solder (second solder) 48c with the main surface of the integrated chip component 44 opposed to the component mounting face of the PCB 38. For this solder connection, Pb-free solder containing no Pb, for example, Sn-3Ag-0.5Cu solder is used. The distance between the main surface of the integrated chip component 44 and the component mounting face of the PCB 38 is, for example, 10 to 20 μm or so. This gap is also filled with resin 45 for sealing without formation of voids.

In the above example, Pb-free solder is used as solder material for use in solder connection of the semiconductor chip IC2, single-chip component 43, and integrated chip component 44. According to the present invention, the solder material is not limited to the foregoing, and various modifications may be made. For example, Sn containing Pb (hereafter, denoted as "Pb—Sn solder") may be used. In consideration of Pb restriction in Europe, Pb-free solder is preferable.

Since bonding wires BW are used for the semiconductor chips IC1 and IC2, a plating layer is formed over all the substrate-side terminals 40a1, 40a2, 40b, and 40c. The plating layer is comprised of, for example, a laminated film obtained by plating a Ni layer and an Au layer in this order from bottom up. Therefore, the single-chip component 43 is solder connected to the plating layer at its connecting terminals, and the integrated chip component 44 is connected to the plating layer at its connecting terminals. At the same time, the bonding wires BW to be connected to the terminals for external formed over the main surfaces of the semiconductor chips IC1 and IC2 are connected to the plating layer over the surfaces of the substrate-side terminals 40c.

Figure 9:
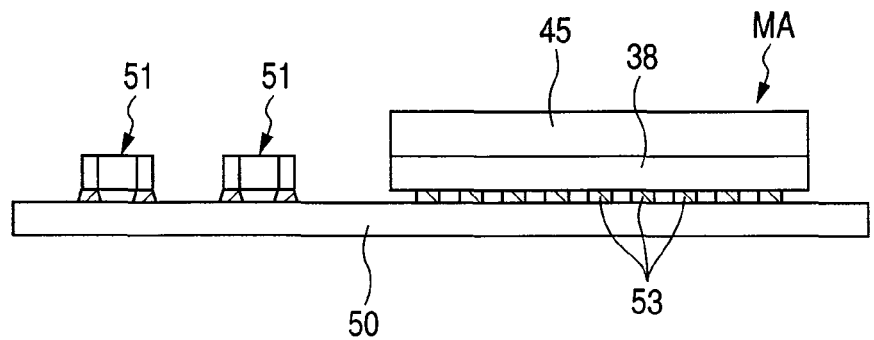
FIG. 9 is a schematic sectional view illustrating an example of the secondary mounting of a module in a digital cellular phone handset in the first embodiment.

Description will be given to the configuration of the module MA that underwent secondary mounting and was mounted over a mounting wiring board (mother board) for incorporation into a product. FIG. 9 illustrates an example of the secondary mounting of the module MA in a digital cellular phone handset in the first embodiment.

The mother board (second wiring board) 50 is comprised of, for example, a printed wiring board having multilayer interconnection structure. Its main surface (first face) is mounted with the module MA and in addition a plurality of single-chip components 51 and the like. As mentioned above, the module MA uses the PCB 38 for its substrate, and the component mounting face of the PCB 38 is covered with the resin 45. Thus, the semiconductor chips IC1 and IC2, single-chip component 43, integrated chip component 44, and the like mounted over the component mounting face of the PCB 38 are sealed. The module MA is mounted over the mother board 50 with the electrodes 42G and 42S and the like formed on the back side of the PCB 38 facing toward the main surface of the mother board 50. The electrodes 42G and 42S are respectively connected to printed wiring formed over the main surface of the mother board 50 through connecting material, for example, solder (third solder) 53.

Figure 10:
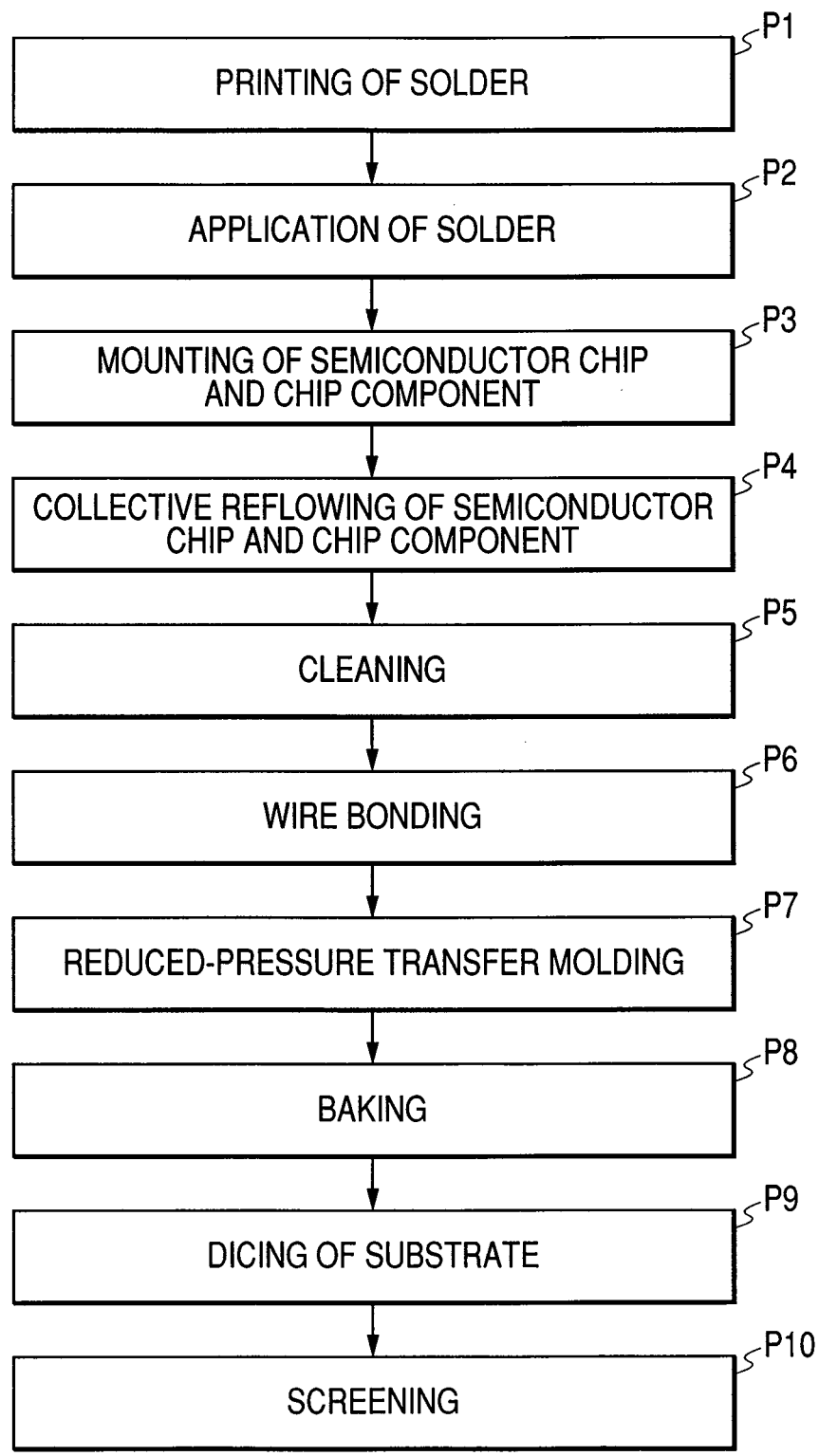
FIG. 10 is a process drawing illustrating an assembling procedure for a module in the first embodiment.
Figure 11:
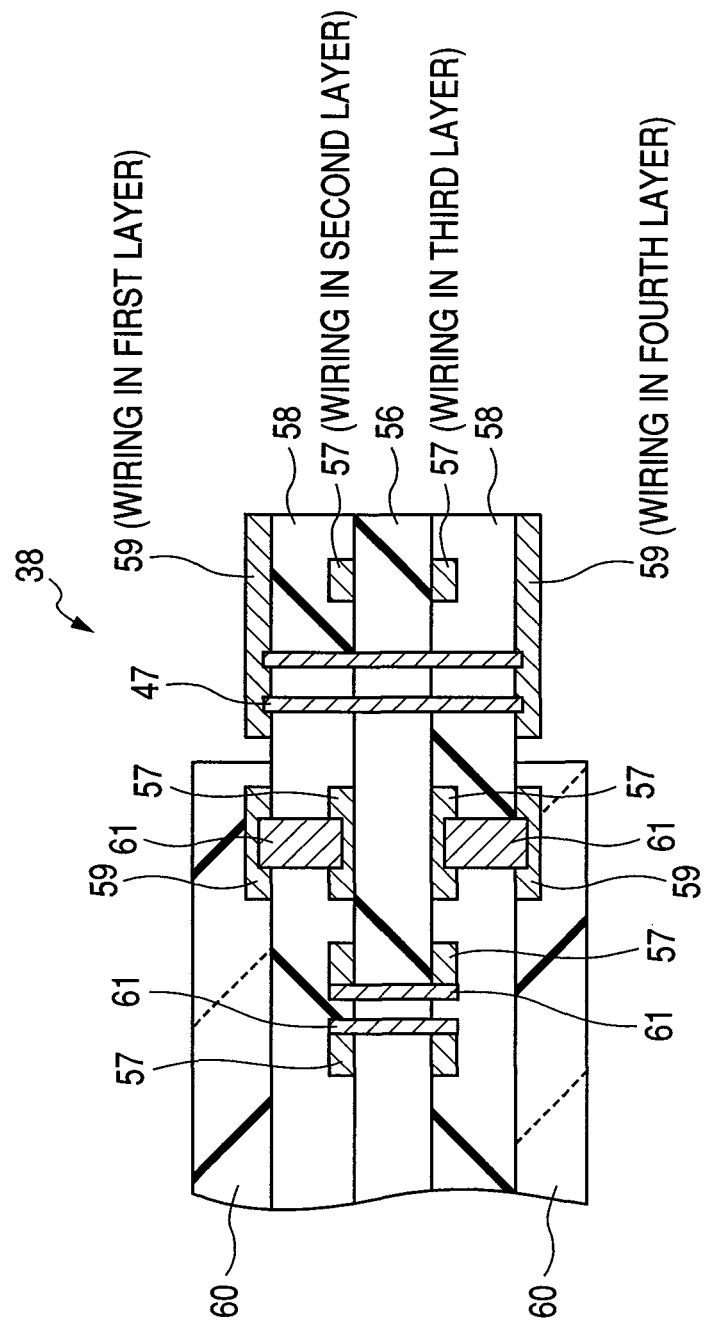
FIG. 11 is a substantial part sectional view of a semiconductor device illustrating a manufacturing method of the semiconductor device in the first embodiment.

Description will be given to an example of the primary mounting process and the secondary mounting process for the module MA in the first embodiment in the order of steps with reference to FIG. 10 to FIG. 19. FIG. 10 is a process drawing explaining an assembling procedure for the module MA; FIG. 11 is a sectional view in which part of the PCB 38 having four copper wiring layers formed is enlarged; FIG. 12 to FIG. 19 are substantial part sectional views of a semiconductor device, showing one module region.

Description will be given to the primary mounting process for the module MA.

The PCB 38 illustrated in FIG. 11 as an example is prepared. The PCB 38 is a multiple wiring substrate on which a plurality (e.g., 120 or so) of module regions as device regions are partitioned by partitioning lines and formed. Where 120 module regions are formed, for example, the substrate is 80 mm×80 mm or so in size and 0.3 mm or so in thickness. In the PCB 38, a Cu film 57 for inner layer (wiring in second layer and wiring in third layer) is patterned and formed above and under a core material 56. These Cu films 57 for inner layer are sandwiched between insulating materials referred to as prepreg 58. The thickness of the Cu film 57 for inner layer is, for example, 0.2 mm or so, and the thickness of the prepreg 58 is, for example, 0.06 mm or so. The outer surface of the prepreg 58 is a face over which the surface mount components such as a semiconductor chip and a chip component in each module region are mounted (component mounting face). Cu films 59 for outer layer (wiring in first layer and wiring in fourth layer) are patterned and formed in tight contact with the prepreg 58. These Cu films 59 for outer layer are the substrate-side terminals 40a1, 40a2, 40b, and 40c illustrated in FIG. 8, and their thickness is, for example, 0.02 mm or so. A plating layer in which, for example, a Ni layer and an Au layer are formed in this order from bottom up is formed over the surfaces of the Cu films 59 for outer layer. Excepting the regions in which surface mount components such as a semiconductor chip and a chip component are mounted, the top of the Cu films 59 for outer layer is covered with solder resist 60. The thickness of the solder resist 60 is, for example, 0.025 to 0.05 mm or so.

The two Cu films 57 for inner layer vertically positioned or the Cu films 57 for inner layer and the Cu films 59 for outer layer are electrically connected with each other through vias 61 that penetrate the core material 56 or the prepreg 58 and are filled with a Cu film. Heat dissipation vias 47 that penetrate the core material 56 and the prepreg 58 and are filled with a Cu film are formed in the region in which the semiconductor chip IC1 is to be mounted in each module region. The core material 56, prepreg 58, and solder resist 60 are formed of resin such as epoxy resin.

Figure 12:
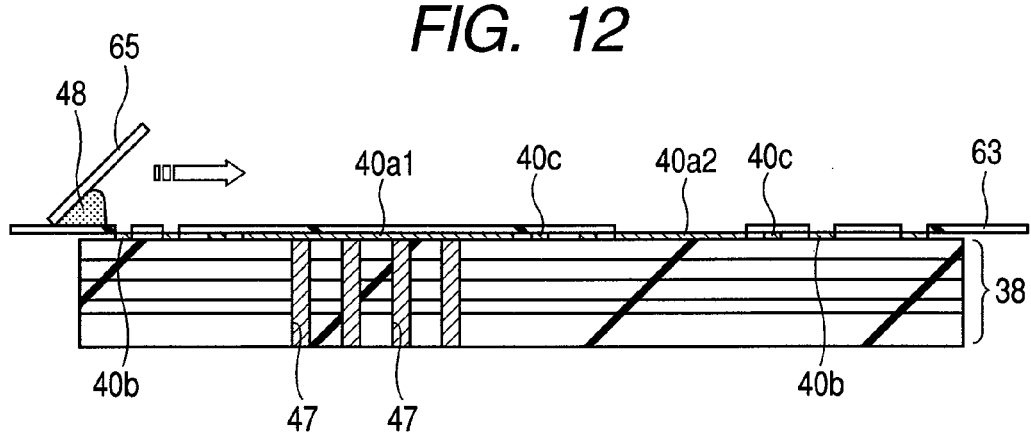
FIG. 12 is a substantial part sectional view of a semiconductor device illustrating the manufacturing method of the semiconductor device, following FIG. 11.
Figure 13:
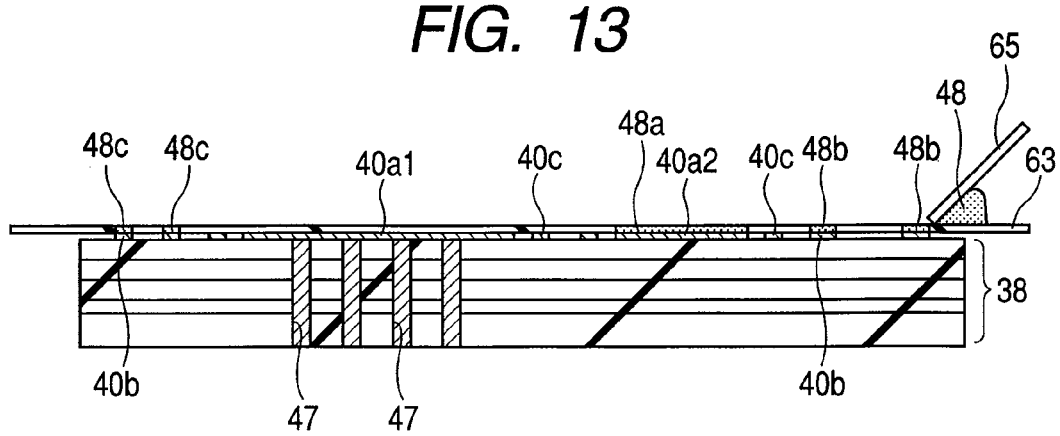
FIG. 13 is a substantial part sectional view of a semiconductor device illustrating the manufacturing method of the semiconductor device, following FIG. 12.
Figure 14:
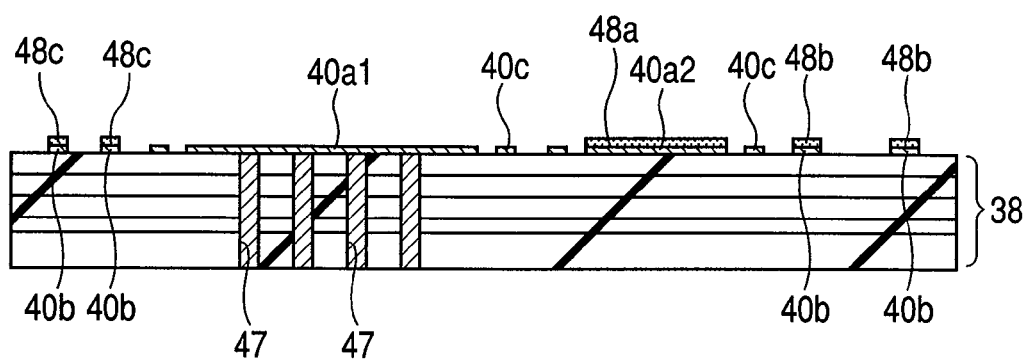
FIG. 14 is a substantial part sectional view of a semiconductor device illustrating the manufacturing method of the semiconductor device, following FIG. 13.

Next, solder is printed (step P1 in FIG. 10). As illustrated in FIG. 12, a mask 63 for printing is placed on the component mounting face of the PCB 38. The mask 63 for printing is formed of, for example, stainless steel, 0.2 mm or so in thickness, and holes are formed in desired places by etching. The mask 63 for printing and the PCB 38 are aligned with each other. Thereafter, solder 48 is placed on the mask 63 for printing at one end, and the solder 48 is moved using a squeegee 65. The solder 48 is Pb-free solder, and, for example, Sn-3Ag-0.5Cu solder is used for this solder. As illustrated in FIG. 13, thus, the solder 48a, 48b, and 48c is printed on predetermined substrate-side terminals 40a2 and 40b formed over the component mounting face of the PCB 38. At this time, the squeegee 65 is inclined to, for example, 45° or so, and this printing operation is performed so that the solder 48 rolls. As illustrated in FIG. 14, subsequently, the mask 63 for printing is removed. As a result, the solder 48a, 48b, and 48c is left on the substrate-side terminals 40a2 and 40b with which the single-chip component 43, integrated chip component 44, and semiconductor chip IC2 are to be connected in subsequent steps.

Figure 15:
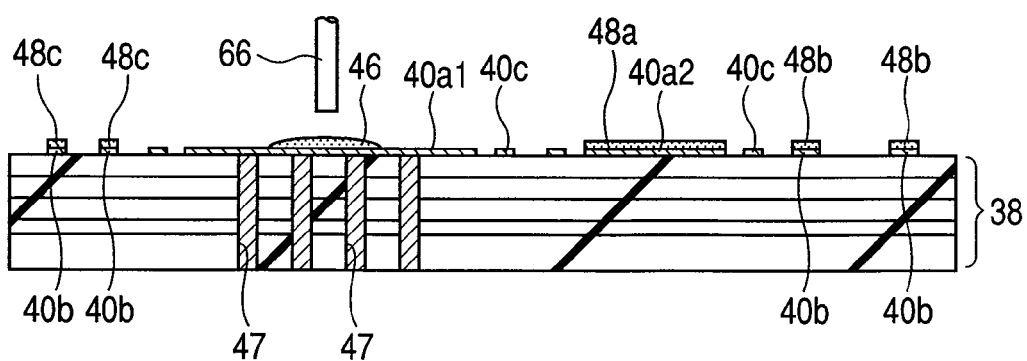
FIG. 15 is a substantial part sectional view of a semiconductor device illustrating the manufacturing method of the semiconductor device, following FIG. 14.

Next, solder for the semiconductor chip IC1 is applied (step P2 in FIG. 10). As illustrated in FIG. 15, solder 46 is supplied from a potting nozzle 66 to a place where the semiconductor chip IC1 is to be mounted. Thus, the solder 46 is applied to the substrate-side terminals 40a1 with which the semiconductor chip IC1 is to be connected. For the solder 46, for example, a high-melting point solder containing Pb that goes into a liquid state at a temperature of 280° C. or higher is used.

Figure 16:
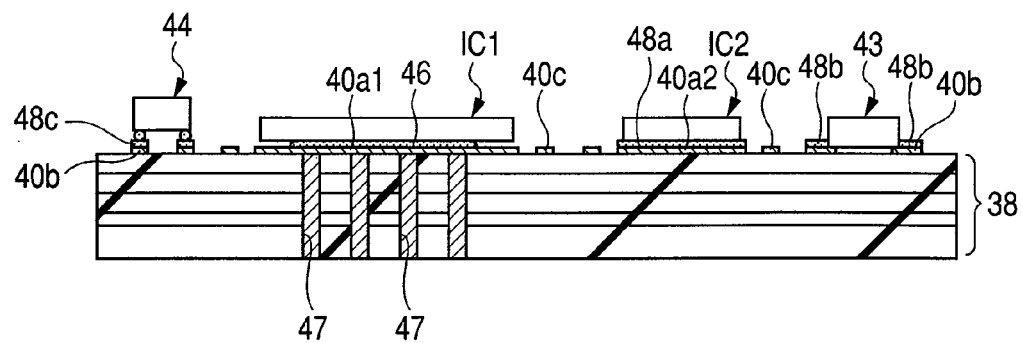
FIG. 16 is a substantial part sectional view of a semiconductor device illustrating the manufacturing method of the semiconductor device, following FIG. 15.
Figure 17:
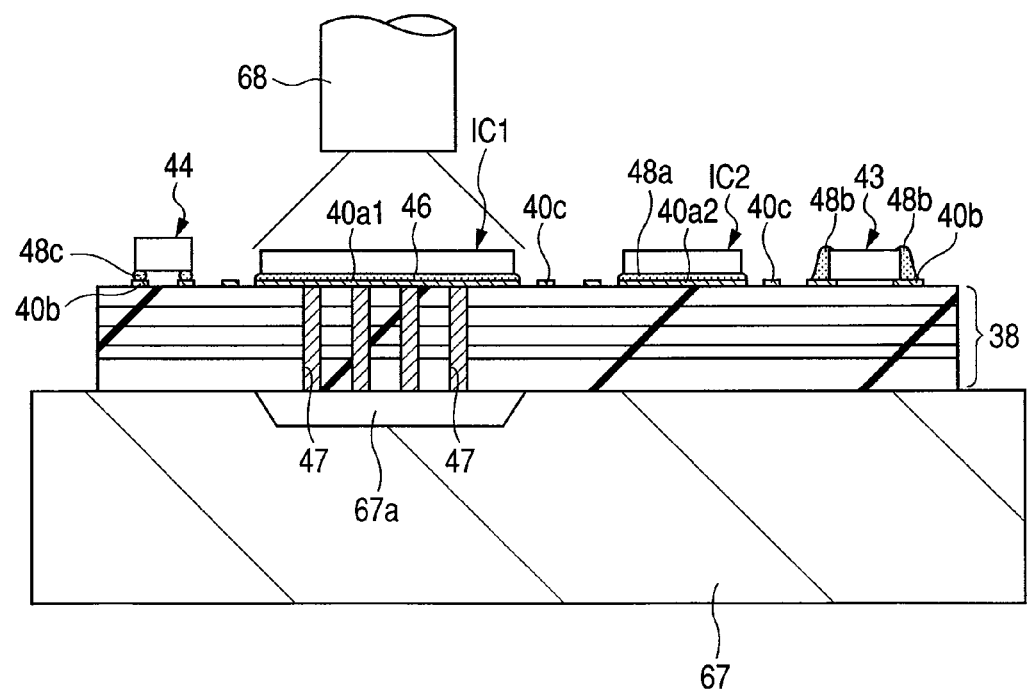
FIG. 17 is a substantial part sectional view of a semiconductor device illustrating the manufacturing method of the semiconductor device, following FIG. 16.

Next, as illustrated in FIG. 16, the single-chip component 43, integrated chip component 44, and semiconductor chips IC1 and IC2 are placed over predetermined substrate-side terminals 40a1, 40a2, and 40b (step P3 in FIG. 10). Subsequently, as illustrated in FIG. 17, the PCB 38 is placed on a heat block 67, and reflow operation is performed to melt the solder 46, 48a, 48b, and 48c. Thus, the above-mentioned surface mount components are solder connected in a lump (step P4 in FIG. 10). At this time, the following measure is taken to prevent the solder resist 60 that constitutes the PCB 38 from being burned and the prepreg 58 from peeling off the core material 56: the temperature of the heat block 67 is set to a temperature below 280° C., for example, 250° C. As the result of heating by the heat block 67, the solder 48a, 48b, and 48c is melted to solder connect the following as follows: the connecting terminals at both ends of the single-chip component 43 and the substrate-side terminals 40b are solder connected together by the solder 48b; the connecting terminals of the integrated chip component 44 and the substrate-side terminals 40b are solder connected together by the solder 48; and the semiconductor chip IC2 and the substrate-side terminals 40a2 are solder connected together by the solder 48c.

In addition to heating by the heat block 67, the semiconductor chip IC1 is locally heated at a temperature of 280° C. or higher, for example, a temperature of 330 to 350° C. To locally heat the semiconductor chip IC1, for example, a hot jet 68 is used. Hot air at 300° C. or higher is jetted out of the nozzle of the hot jet 68, and the solder 46 is thereby melted to solder connect together the semiconductor chip IC1 and the substrate-side terminals 40a1. The hot jet is so structured that a nichrome wire is wound around a pipe, 1 to 2 mm or so in inside diameter. The air guided into the pipe is heated to a desired temperature by the nichrome wire, and dry air at 300° C. or higher is jetted out of the nozzle of the hot jet 68. The time of a single heating operation by the hot jet 68 is, for example, 5 seconds or so, and the flow rate of dry air is, for example, 8 liters/min or so. With the back side of the semiconductor chip IC1 in contact with the heat block 67 through the solder 46, heat dissipates and escapes, which can prevent the temperature of the semiconductor chip IC1 from rising. To avoid this, the following measure is taken to prevent the back side of the semiconductor chip IC1 and the heat block 67 from being brought into contact with each other: a recess 67a is formed in the area on the heat block 67 where the semiconductor chip IC1 is to be placed.

As mentioned above, solder connection is carried out as follows: solder connection of the single-chip component 43, integrated chip component 44, and semiconductor chip IC2 using the solder 48a, 48b, and 48c is carried out by heat treatment at a temperature below 280° C. with the PCB 38, mounted with the individual surface mount components, placed on the heat block 67; at the same time, solder connection of the semiconductor chip IC1 using the solder 46 is carried out by heat treatment at a temperature of 280° C. or higher using the hot jet. Thus, the semiconductor chip IC1 can be solder connected to the PCB 38 using high-melting point solder (solder 46) without the following troubles: damage to the PCB 38 due to heat, for example, burning of the solder resist 60 and peeling of the prepreg 58 from the core material 56; and melting of Pb-free solder (solder 48a, 48b, and 48c). As a result, the semiconductor chip IC1 having strong adhesive strength can be mounted over the PCB 38.

Figure 18:
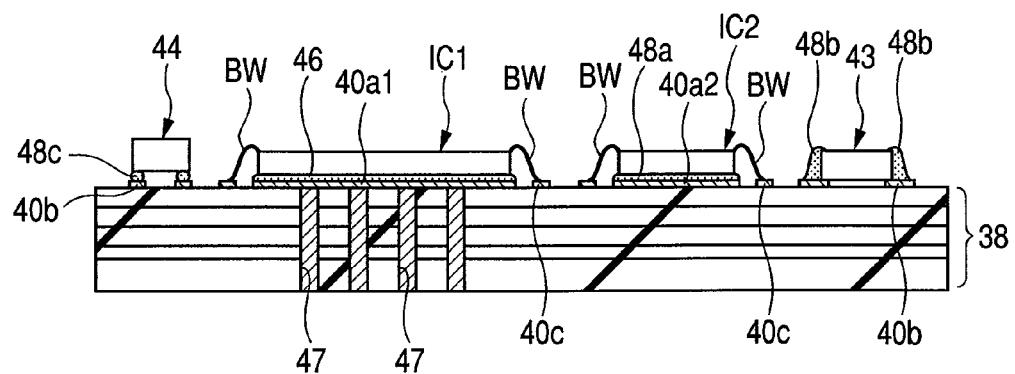
FIG. 18 is a substantial part sectional view of a semiconductor device illustrating the manufacturing method of the semiconductor device, following FIG. 17.

Next, the PCB 38 to which the individual surface mount components are solder connected is cleaned (step P5 in FIG. 10), and subsequently, wire bonding (step P6 in FIG. 10) is carried out. At this time, as illustrated in FIG. 18, the pads exposed in the upper faces of the semiconductor chips IC1 and IC2 and the substrate-side terminals 40c with a plating layer formed over their surfaces are connected together using bonding wires BW, for example, Au wires.

Figure 19:
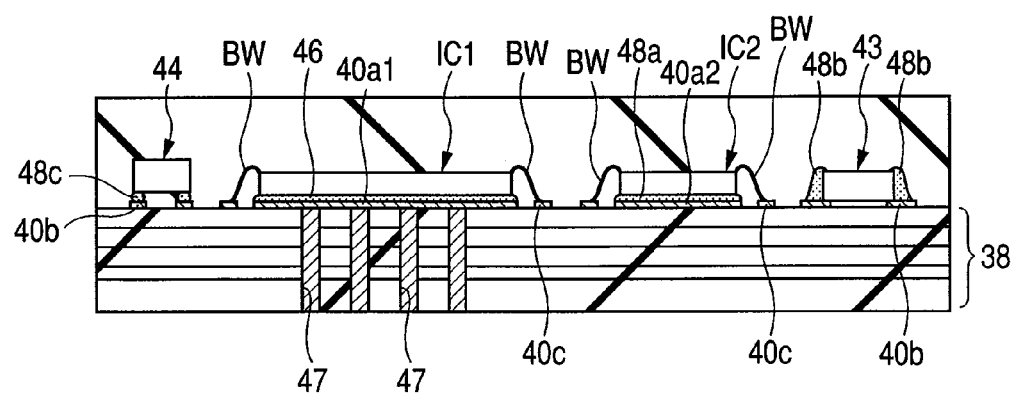
FIG. 19 is a substantial part sectional view of a semiconductor device illustrating the manufacturing method of the semiconductor device, following FIG. 18.

Next, transfer molding is carried out to seal the individual surface mount components with resin 45 (step P7 in FIG. 10). The upper die of a molding machine is moved up, and the PCB 38 with the individual surface mount components solder connected thereto is placed in the lower die. Thereafter, the upper die is moved down to clamp the PCB 38. The upper die is provided with an air vent for letting out the air and the resin between the upper molding die and the lower molding die. Subsequently, the interior of the molding dies is forcedly depressurized to, for example, 1 Torr or below. Then, resin tablets are heated by a preheater to lower the viscosity of the resin, and the liquefied resin 45 is pressure fed into the interior of the molding dies. For the resin 45, for example, a thermosetting epoxy resin is used. Subsequently, the resin for sealing filled in the molding dies is cured by polymerization reaction, and then the upper die and the upper die are separated and the PCB 38 covered with the resin 45 is taken out. Thereafter, the unnecessary resin 45 for sealing is removed, and baking is carried out (step P8 in FIG. 10) to complete the polymerization reaction. Thus, the module MA in which the individual surface mount components are sealed with the resin 45, illustrated in FIG. 19, is finished.

As mentioned above, the interior of the molding dies is depressurized, and then the resin 45 is injected. Thus, the flowability of the resin 45 can be ensured. Therefore, the resin 45 can be filled in narrow gaps with formation of voids prevented. Examples of such narrow gaps include the gap between the back side of the single-chip component 43 and the component mounting face of the PCB 38 (10 μm or so); and the gap between the main surface of the integrated chip component 44 and the component mounting face of the PCB 38 (30 μm or so). As a result, the Pb-free solder can be prevented from flowing like a flash even if heat at a temperature of, for example, 250° C. or so is applied and the Pb-free solder partially melts during assembly of the module MA described next. Therefore, for example, connecting terminals at both ends of the single-chip component 43 or connecting terminals over the main surface of the integrated chip component 44 are not joined with each other, and short-circuiting can be avoided.

Next, the resin 45 for sealing and the PCB 38 are cut along dicing lines and separated into individual modules MA (step P9 in FIG. 10). Thereafter, for example, a trademark, a product name, a lot number, and the like are stamped on the surface of the resin 45 covering each module MA. Thereafter, the electrical characteristics of the modules MA are measured with respect to items covered in product specifications, and the modules MA are screened (step P10 in FIG. 10).

Description will be given to the secondary mounting process for the module MA.

The electrodes 42G and 42S for solder connection are formed on the back side of the PCB 38 so that the module can be mounted over the mother board 50. First, solder paste is printed on the mother board 50. Subsequently, the module MA is placed over the mother board 50, and reflowing operation is performed at a temperature of, for example, 250° C. or so to mount the module MA over the mother board 50. Thereafter, testing is conducted for electrical characteristics, and the mounting is completed. In the secondary mounting, the above-mentioned reflowing operation is performed using Pb-free solder at a temperature (e.g., 250° C. or so) higher than the temperature (e.g., for 220° C. or so) at which the single-chip component 43, integrated chip component 44, and semiconductor chip IC2 are solder connected to the PCB 38. Therefore, the Pb-free solder can melt. However, the amount of Pb-free solder used for solder connection between the single-chip component 43, integrated chip component 44, or semiconductor chip IC2 and the PCB 38 can be reduced as compared with the amount of solder used for solder connection between the module MA and the mother board 50. Therefore, the amount of molten solder is small, and the solder does not flow like a flash and short-circuiting between connecting terminals of the single-chip component 43 or the integrated chip component 44 does not result.

In the above description of the first embodiment, the individual surface mount components mounted over the PCB 38 are covered with the highly elastic resin 45. The present invention is not limited to this construction. For example, a low-elasticity resin, for example, silicon resin may be used.

The above description is given to a case where the present invention is applied to a device of dual band type that can handle radio waves in two frequency bands, the GSM900 band and the GSM1800 band. The present invention is not limited to this. It may be applied to a device of triple band type that can handle radio waves in three frequency bands, for example, the GSM900, GSM1800, and GSM1900 bands. The present invention can also cope with the 800 MHz band and the 850 MHz band.

In the first embodiment, solder connection of the single-chip component 43 and the integrated chip component 44 is carried out by heat treatment at a temperature below 280° C. using the heat block 67. Therefore, Pb-free solder can be used, and damage to the PCB 38 due to heat, for example, burning of the solder resist 60 and peeling of the prepreg 58 from the core material 56 can be avoided. Simultaneously with the above-mentioned solder connection, solder connection of the semiconductor chip IC1 is carried out by heat treatment at a temperature of 280° C. or higher using a hot jet. Therefore, a high-melting point solder can be used for solder connection of the semiconductor chip IC1. As a result, the semiconductor chip IC1 having strong adhesive strength can be mounted over the PCB 38.

The flowability of the resin 45 can be ensured by depressurizing the interior of the molding dies and injecting the resin 45. Therefore, for example, the following narrow gaps can be filled with the resin 45 without formation of voids: the narrow gap between the backside of the single-chip component 43 and the component mounting face of the PCB 38; and the narrow gap between the main surface of the integrated chip component 44 and the component mounting face of the PCB 38. Thus, after the module MA is solder connected to the mother board 50, the Pb-free solder in the module MA can be prevented from flowing like a flash even if heat at a temperature of, for example, 250° C. or so is applied and the Pb-free solder partially melts. Therefore, for example, connecting terminals at both ends of the single-chip component 43 or connecting terminals over the main surface of the integrated chip component 44 are not joined with each other. As a result, short-circuiting can be avoided.

Second Embodiment

Figure 20:
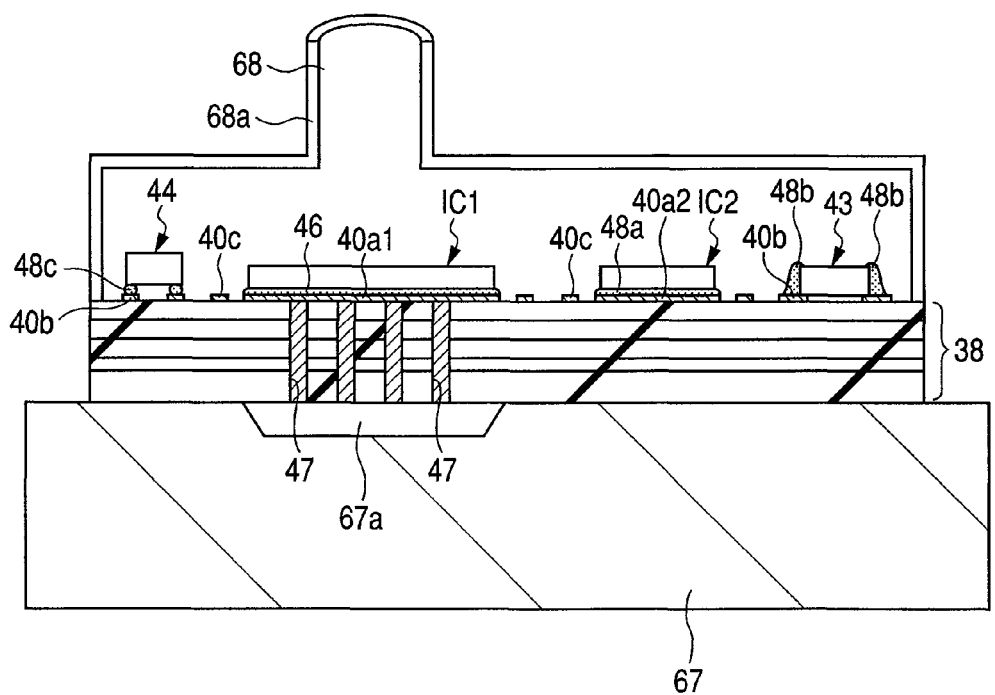
FIG. 20 is a schematic sectional view illustrating another example of a mounting process in a second embodiment in which surface mount components are solder connected to a module substrate in a lump.

Description will be given to another example of a mounting process in which individual surface mount components are solder connected to a module substrate in a lump, in a second embodiment. FIG. 20 is a substantial part sectional view of a semiconductor device, explaining a mounting method following the FIG. 16 associated with the first embodiment.

As in the first embodiment, a semiconductor chip IC1 is locally heated at a temperature of 280° C. or higher, for example, a temperature of 330 to 350° C. using a hot jet 68. The semiconductor chip IC1 and substrate-side terminals 40a1 are connected with each other by high-melting point solder. At this time, a heat block 67 is not heated, and all the surface mount components mounted over PCB 38 are covered with a cover 68a. Pb-free solder is melted by after heat produced when dry air jetted onto the semiconductor chip IC1 out of the nozzle of the hot jet 68 diffuses inside the cover 68a. The regions other than the semiconductor chip IC1 are heated only by heat escaping from the dry air jetted out of the nozzle of the hot jet 68. The regions include regions where a single-chip component 43 and substrate-side terminals 40b, an integrated chip component 44 and substrate-side terminals 40b, and a semiconductor chip IC2 and substrate-side terminals 40a2 are connected with each other. Therefore, the temperature of these regions can be controlled to a temperature below 280° C., for example, 150° C. or so. Thus, burning of solder resist 60 and peeling of prepreg 58 from a core material 56 can be prevented. The steps subsequent to this step of solder connection are the same as in the first embodiment, and the description thereof will be omitted.

In the second embodiment, as mentioned above, solder connection of the single-chip component 43, integrated chip component 44, or semiconductor chip IC2 using Pb-free solder is carried out by the following: heat treatment at a temperature below 280° C. using diffusion of dry air jetted out of the hot jet 68. Thus, melting of Pb-free solder and damage to the PCB 38 due to heat can be prevented.

Third Embodiment

Figure 21:
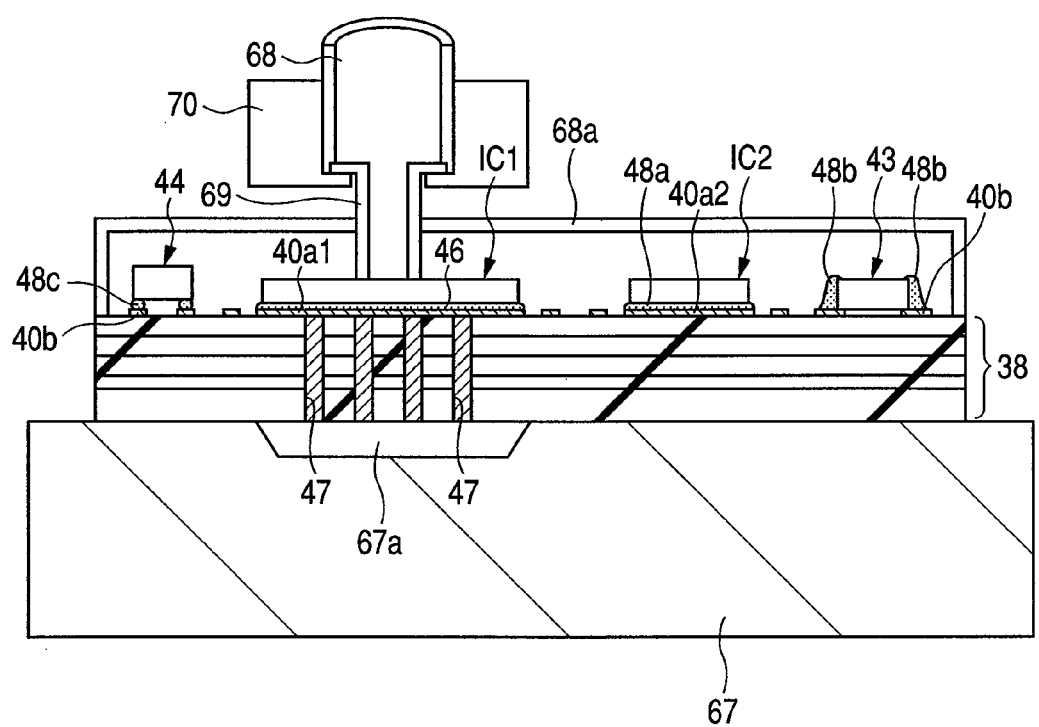
FIG. 21 is a schematic sectional view illustrating another example of a mounting process in a third embodiment in which surface mount components are solder connected to a module substrate in a lump.

Description will be given to another example of a mounting process in which surface mount components are solder connected to a module substrate in a lump, in a third embodiment. FIG. 21 is a substantial part sectional view of a semiconductor device, explaining a mounting method following FIG. 16 associated with the first embodiment.

As in the second embodiment, a heat block 67 is not heated, and all the surface mount components mounted over PCB 38 are covered with a cover 68a. A semiconductor chip IC1 is locally heated at a temperature of 280° C. or higher, for example, a temperature of 330 to 350° C. using a hot jet 68. The semiconductor chip IC1 and substrate-side terminals 40a1 are connected with each other by high-melting point solder. Ob-free solder is melted by after heat produced when dry air jetted out of the nozzle of the hot jet 68 diffuses inside the cover 68a. A single-chip component 43 and substrate-side terminals 40b, an integrated chip component 44 and substrate-side terminals 40b, and a semiconductor chip IC2 and substrate-side terminals 40a2 are thereby connected with each other.

In addition, the third embodiment is provided at the air outlet of the hot jet 68 with a loading pin 69 to let out voids produced between the semiconductor chip IC1 and the PCB 38. The semiconductor chip IC1 is held down by this loading pin 69. The joint between the air outlet of the hot jet 68 and the loading pin 69 is heated by a heater 70, and thus the temperature of dry air is prevented from being lowered due to the loading pin 69. Without extreme drop in temperature of dry air, the heater 70 need not be provided. The steps subsequent to this step of solder connection are the same as in the first embodiment, and the description thereof will be omitted.

In the third embodiment, as mentioned above, voids produced between the semiconductor chip IC1 and the PCB 38 can be let out by holding down the semiconductor chip IC1 with the loading pin 69. Therefore, the adhesive strength between the semiconductor chip IC1 and the PCB 38 can be further enhanced than in the first embodiment.

Fourth Embodiment

Figure 22:
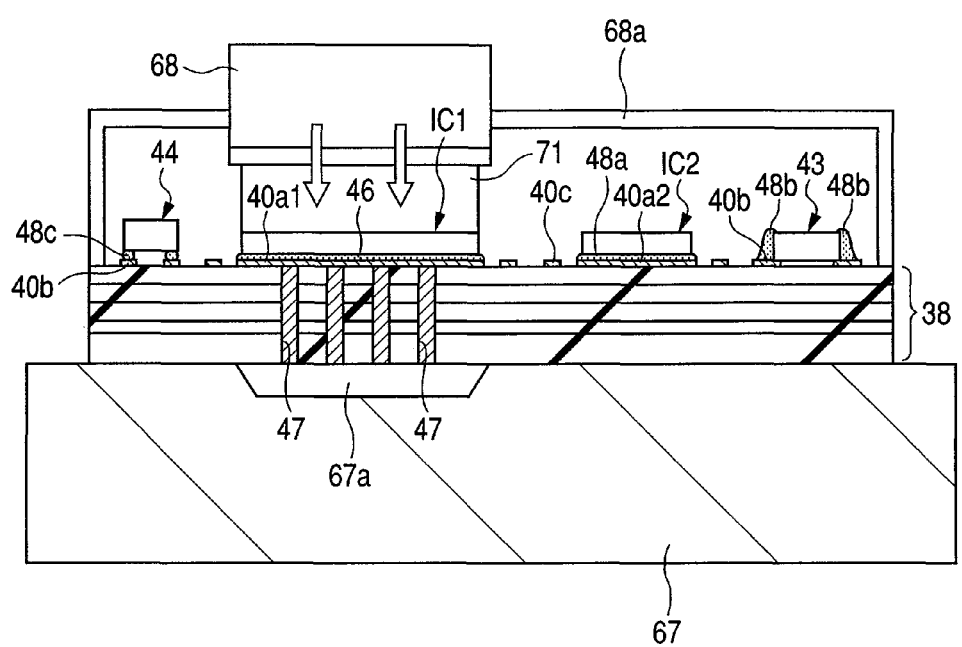
FIG. 22 is a schematic sectional view illustrating another example of a mounting process in a fourth embodiment in which surface mount components are solder connected to a module substrate in a lump.

Description will be given to another example of a mounting process in which surface mount components are solder connected to a module substrate in a lump, in a fourth embodiment. FIG. 22 is a substantial part sectional view of a semiconductor device, explaining a mounting method following FIG. 16 associated with the first embodiment.

As in the second embodiment, a heat block 67 is not heated, and all the surface mount components mounted over PCB 38 are covered with a cover 68a. A semiconductor chip IC1 is locally heated at a temperature of 280° C. or higher, for example, a temperature of 330 to 350° C. using a hot jet 68. The semiconductor chip IC1 and substrate-side terminals 40a1 are connected with each other by high-melting point solder. Pb-free solder is melted by after heat produced when dry air jetted out of the nozzle of the hot jet 68 diffuses inside the cover 68a. A single-chip component 43 and substrate-side terminals 40*b*, an integrated chip component 44 and substrate-side terminals 40*b*, and a semiconductor chip IC2 and substrate-side terminals 40*a*2 are thereby connected with each other.

In addition, the fourth embodiment is provided at the air outlet of the hot jet 68 with a block 71 to let out voids produced between the semiconductor chip IC1 and the PCB 38. This block 71 is brought into contact with the entire semiconductor chip IC1, and pressure is applied by the hot jet 68 while heat is being applied by the hot jet 68. The block 71 has a heater built therein, and drop in the temperature of dry air is prevented by bringing the block 71 into contact with the semiconductor chip IC1. At least the portion of the block 71 brought into contact with the semiconductor chip IC1 uses ceramics. The steps subsequent to this step of solder connection are the same as in the first embodiment, and the description thereof will be omitted.

In the fourth embodiment, as mentioned above, voids produced between the semiconductor chip IC1 and the PCB 38 can be let out by applying pressure to the semiconductor chip IC1 with the block 71. Therefore, the adhesive strength between the semiconductor chip IC1 and the PCB 38 can be further enhanced than in the first embodiment.

Up to this point, concrete description has been given to the invention made by the present inventors based on embodiments. However, the present invention is not limited to the above-mentioned embodiments, and various modifications can be made without departing from the sprit of the invention, needless to add.

The above description mainly takes as examples cases where the invention made by the present invention is applied to digital cellular phone handsets in the field of utilization that underlies the invention. The present invention is not limited to them. For example, the present invention is also applicable to mobile information processors such as PDAs (Personal Digital Assistants) provided with communication function and information processors such as personal computers provided with communication function.

The present invention can be widely used in manufacturing industries that manufacture semiconductor devices.

What is claimed is:

1. A method of manufacturing an electronic device comprising:
   (a) preparing a wiring substrate;
   (b) mounting a semiconductor chip on a main surface of the wiring substrate;
   (c) mounting a single-chip component on a first terminal of the obverse surface of the wiring substrate using a first solder;
   (d) connecting the single-chip component with the wiring substrate electrically by melting the first solder; and
   (e) forming a sealing body by sealing the semiconductor chip and the single-chip component with a resin,
   wherein a melting point of the first solder in the step (c) is lower than a temperature when the electronic device is soldered with a mounting wiring substrate, and
   wherein the step (e) is implemented while decompressed such that the resin fills a clearance between the wiring substrate and the single-chip component.

2. The method of manufacturing an electronic device according to claim 1:
   wherein the step (e) comprises:
   (e1) preparing an upper molding die and a lower molding die corresponding the upper die, the upper die has an empty space and an air vent with which is connected the empty space;
   (e2) disposing the wiring substrate on the lower molding die;
   (e3) clamping the wiring substrate between the upper molding die and the lower molding die such that the semiconductor chip and the single-chip component are disposed in the empty space of the upper molding die;
   (e4) decompressing the empty space by exhausting an air in the empty space outside from the air vent;
   (e5) pressuring a liquidized resin into the empty space; and
   (e6) after the resin becomes hardened, opening the upper molding die and the lower molding die, and ejecting the wiring substrate formed the sealing body.

3. The method of manufacturing an electronic device according to claim 2:
   wherein the empty space is decompressed to 1 Torr or less.

4. The method of manufacturing an electronic device according to claim 1:
   wherein a connecting terminal is formed at both sides of the single-chip component, and
   wherein the first solder connects the connecting terminal of the single-chip component and the first terminal of the wiring substrate.

5. The method of manufacturing an electronic device according to claim 1:
   wherein the single-chip component contains at least one of a capacitor, an inductor, a register and a ferrite bead.

6. The method of manufacturing an electronic device according to claim 1:
   wherein the first solder is Pb-free solder.

7. The method of manufacturing an electronic device according to claim 6:
   wherein the Pb-free solder is Sn-3Ag-0.5Cu solder.

8. The method of manufacturing an electronic device according to claim 1:
   wherein the clearance is formed between a rear surface of the single-chip component and the main surface of the wiring substrate.

9. The method of manufacturing an electronic device according to claim 8:
   wherein a distance of the clearance is about 10 μm.

10. The method of manufacturing an electronic device according to claim 1 further comprising:
    connecting the semiconductor chip and the wiring substrate electrically using bonding wire between step (d) and step (e).

11. The method of manufacturing an electronic device according to claim 1:
    wherein a reflow temperature when the electronic device is soldered with a mounting wiring substrate is about 250 degrees.

12. The method of manufacturing an electronic device according to claim 1:
    wherein the semiconductor chip is mounted on a second terminal of the main surface of the wiring substrate via a second solder.

13. The method of manufacturing an electronic device according to claim 12:
    wherein a melting point of the second solder is higher than the temperature when the electronic device is soldered with a mounting wiring substrate.

14. The method of manufacturing an electronic device according to claim 12:
    wherein the second solder connects a rear surface of the semiconductor chip and the second terminal of the wiring substrate electrically.

* * * * *